(12) United States Patent
Lin et al.

(10) Patent No.: US 12,268,007 B2
(45) Date of Patent: Apr. 1, 2025

(54) MEMORY DEVICE INCLUDING ETCH STOP PATTERN AND METHOD OF FORMING THE SAME

(71) Applicant: Taiwan Semiconductor Manufacturing Company, Ltd., Hsinchu (TW)

(72) Inventors: Meng-Han Lin, Hsinchu (TW); Han-Jong Chia, Hsinchu (TW); Feng-Cheng Yang, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 405 days.

(21) Appl. No.: 17/574,518

(22) Filed: Jan. 12, 2022

(65) Prior Publication Data

US 2023/0225131 A1    Jul. 13, 2023

(51) Int. Cl.
*H10B 51/20*    (2023.01)
*H01L 29/24*    (2006.01)
*H01L 29/417*    (2006.01)
*H10B 51/10*    (2023.01)

(52) U.S. Cl.
CPC ............ *H10B 51/20* (2023.02); *H01L 29/24* (2013.01); *H01L 29/41741* (2013.01); *H01L 29/41775* (2013.01); *H10B 51/10* (2023.02)

(58) Field of Classification Search
CPC ........ H10B 51/10; H10B 51/20; H10B 51/30; H01L 29/24; H01L 29/41741; H01L 29/41775
See application file for complete search history.

(56) References Cited

U.S. PATENT DOCUMENTS

| | | | | |
|---|---|---|---|---|
| 9,960,181 | B1 * | 5/2018 | Cui | H10B 41/50 |
| 2017/0287926 | A1 * | 10/2017 | Ariyoshi | H01L 29/41741 |
| 2019/0115362 | A1 * | 4/2019 | Choi | H10B 43/50 |
| 2019/0305096 | A1 * | 10/2019 | Choi | H01L 29/41741 |
| 2022/0399364 | A1 * | 12/2022 | Kim | H10B 43/50 |
| 2022/0399365 | A1 * | 12/2022 | Choi | H10B 43/10 |

FOREIGN PATENT DOCUMENTS

| | | | | |
|---|---|---|---|---|
| JP | 2012038994 A | * | 2/2012 | |
| WO | WO-2021247084 A1 | * | 12/2021 | H01L 27/11519 |

* cited by examiner

*Primary Examiner* — Matthew E Warren
(74) *Attorney, Agent, or Firm* — JCIPRNET

(57) ABSTRACT

A memory device includes a first etch stop layer, an etch stop pattern, a second etch stop layer, a plurality of stacks and a first conductive pillar. The etch stop pattern is disposed in the first etch stop layer. The second etch stop layer is disposed on the first etch stop layer and the etch stop pattern, wherein a material of the etch stop pattern is different from a material of the first etch stop layer and a material of the second etch stop layer. The stacks are disposed on the second etch stop layer. The first conductive pillar is disposed between the stacks, wherein the first conductive pillar extends along the stacks and the second etch stop layer to be in physical contact with the etch stop pattern.

20 Claims, 38 Drawing Sheets

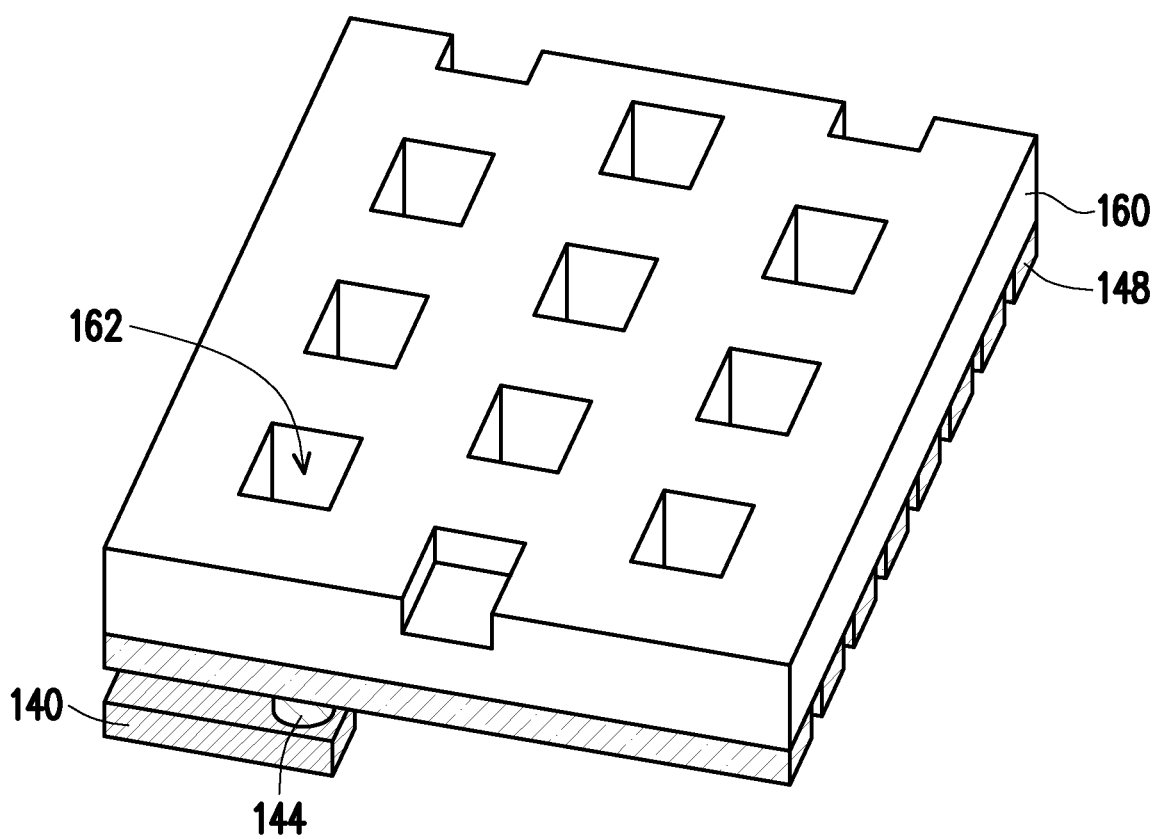
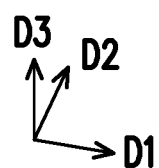
FIG. 3

MEMORY DEVICE INCLUDING ETCH STOP PATTERN AND METHOD OF FORMING THE SAME

BACKGROUND

As the size of the integrated circuit keeps decreasing, the integration density of the component or device gradually increases. Semiconductor memory devices include volatile memories and non-volatile memories. For semiconductor memory devices, the increased memory cell density leads to compact structure designs with reduced sizes but maintaining the performance of the semiconductor memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 to FIG. 29 show schematic three-dimensional views of structures produced at various stages of a manufacturing method of a memory device according to some embodiments of the present disclosure.

DETAILED DESCRIPTION

Figure 1:
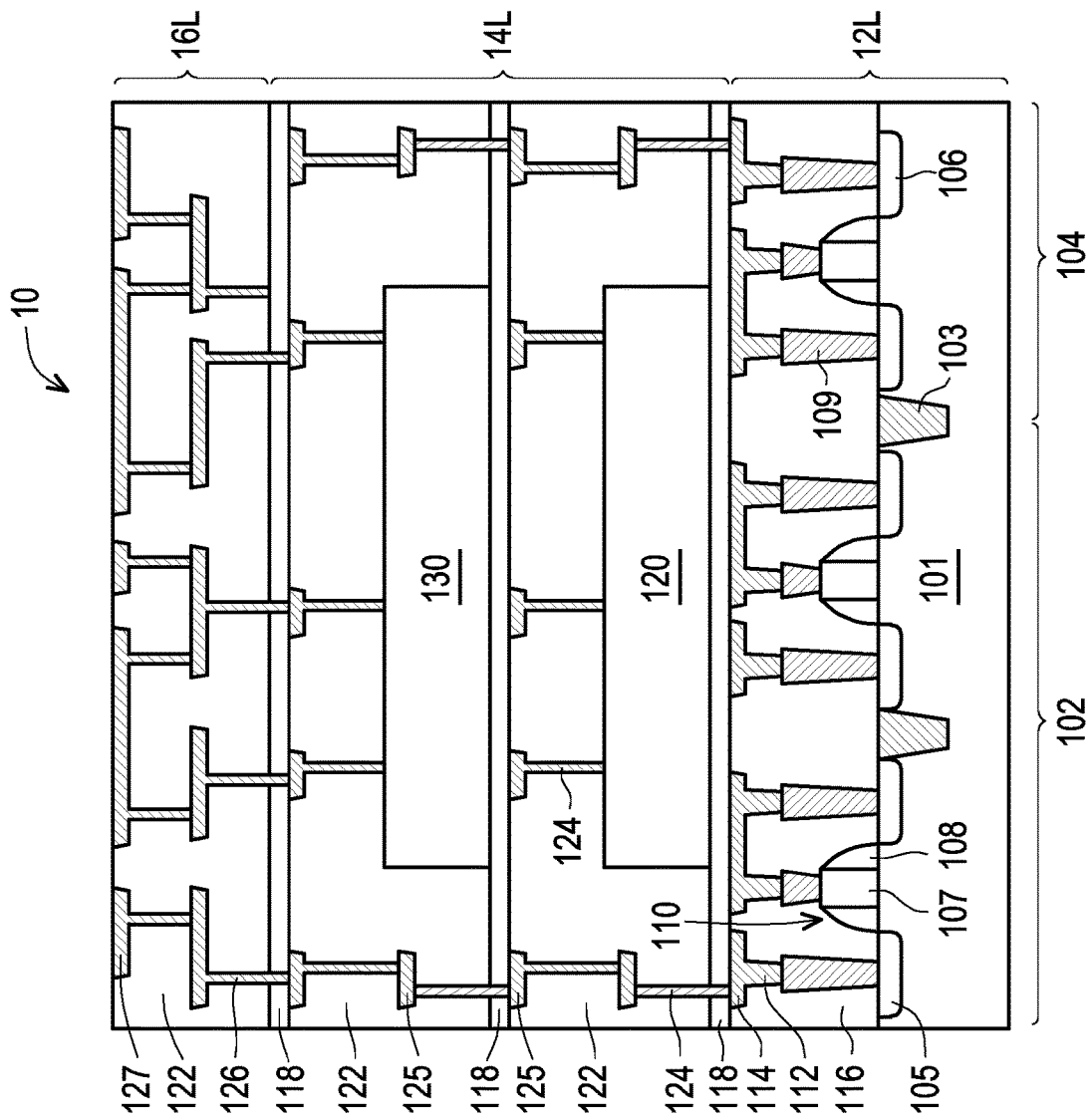
FIG. 1 illustrates a cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a cross-sectional view of a semiconductor device 10 in accordance with some embodiments. In some embodiments, the semiconductor device 10 is formed with integrated memory devices 120 and 130. The semiconductor device 10 may include active devices 110 and three-dimensional (3D) memory devices 120, 130. The active devices 110 may be field effect transistor (FET) devices. In one embodiment, the active devices 110 are formed through the front-end-of-line (FEOL) manufacturing processes and include fin field effect transistors (FinFETs). The at least one of the memory devices 120, 130 may include three-dimensional (3D) ferroelectric random access memory (FeRAM) devices formed through the back-end-of-line (BEOL) manufacturing processes. It is understood that FinFETs are used as examples, and other kinds of FEOL devices such as planar transistors or gate-all-around (GAA) transistors may be used herein and included within the scope of the present disclosure. That is, the 3D memory devices 120, 130 may be integrated with or in any suitable semiconductor devices. In FIG. 1, the details of the memory devices 120, 130 are not shown and further details will be described later in subsequent figures.

As illustrated in FIG. 1, the semiconductor device 10 includes different regions for forming different types of circuits. For example, the semiconductor device 10 includes a first region 102 for forming logic circuits and a second region 104 for forming peripheral circuits, input/output (I/O) circuits, electrostatic discharge (ESD) circuits, and/or analog circuits. The semiconductor device 10 may also include other regions for forming other types of circuits which are fully intended to be included within the scope of the present disclosure. The semiconductor device 10 includes a substrate 101. In some embodiments, the substrate 101 is a bulk substrate, such as a silicon substrate, doped or undoped, or an active layer of a semiconductor-on-insulator (SOI) substrate. In some embodiments, the substrate 101 includes other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. For example, additional electrical components, such as resistors, capacitors, inductors, diodes, or the like, is formed in or on the substrate 101 during the FEOL manufacturing processes.

As seen in FIG. 1, the active devices 110 are formed on the substrate 101, and isolation regions 103, such as shallow trench isolation (STI) regions, are formed between or around the active devices 110. In some embodiments, the active device 110 includes a gate electrode 107 and source/drain regions 105/106. The gate electrode 107 may be formed over the substrate 101 with gate spacers 108 along sidewalls of the gate electrode 107. The source/drain regions 105/106 such as doped or epitaxial source/drain regions are formed on opposing sides of the gate electrode 107. In some embodiments, conductive contacts 109, such as gate contacts and source/drain contacts, are formed over and electrically coupled to respective underlying electrically conductive features (e.g., gate electrodes 107 or source/drain regions 105/106). In some embodiments, a dielectric layer 116, such as an inter-layer dielectric (ILD) layer, is formed over the substrate 101 and covering the source/drain regions 105/106, the gate electrode 107 and the contacts 109, and other electrically conductive features, such as conductive interconnect structures including conductive vias 112 and conductive lines 114, are embedded in the dielectric layer 116. It is understood that the dielectric layer 116 may include more than one dielectric layers of the same or different dielectric materials. Collectively, the substrate 101, the active devices 110, the contacts 109, conductive features 112/114, and the dielectric layers 116 shown in FIG. 1 may be referred to as the front-end level 12L.

Referring to FIG. 1, dielectric layers 118 and dielectric layers 122 are formed over the dielectric layer 116 in alternation. In one embodiment, at least one of the dielectric layers 118 includes an etch stop layer (ESL). In some embodiments, the materials of the dielectric layers 118 is different from the materials of the dielectric layers 116 and 122. In some embodiments, the material of the dielectric layer(s) 118 includes silicon nitride or carbide formed by plasma-enhanced physical vapor deposition (PECVD). In some embodiments, one or more of the dielectric layers 118 is omitted. In some embodiments, the dielectric layers 116 and 122 is formed of any suitable dielectric material, such as silicon oxide, silicon nitride, silicon oxynitride, phosphosilicate glass (PSG), borosilicate glass (BSG), boron-doped phosphosilicate glass (BPSG), or low-k materials, formed by a suitable method, such as spin coating, physical vapor deposition (PVD), chemical vapor deposition (CVD), or the like. In FIG. 1, memory devices 120 and 130, each of which may include a plurality of memory cells, are formed in the dielectric layer 122 and coupled to electrically conductive features (e.g., conductive vias 124 and conductive lines 125) in the dielectric layer 122.

In FIG. 1, the memory devices 120 and 130 are formed at different layers of the dielectric layers 122. The memory device 120 is formed at the lower layer, and the memory device 130 is formed at the upper layer. In some embodiments, the memory devices 120 and 130 have the same or similar structure. In some embodiments, the memory devices 120 and 130 have different structure designs. Although two layers of memory devices are depicted in FIG. 1, other numbers of layers of memory devices, such as one layer, three layers, or more, are also possible and are encompassed within the scope of the present disclosure. Collectively, the layers of memory device 120 and 130 are referred to as the memory device level 14L or a memory region of the semiconductor device 10. The memory device level 14L may be formed in the BEOL processes of semiconductor manufacturing. The memory devices 120 and 130 may be formed in the BEOL processes at any suitable locations within the semiconductor device 10, such as over the first region 102, over the second region 104, or over a plurality of regions.

After the memory device level 14L is formed, an interconnect level 16L including electrically conductive interconnecting features (e.g., conductive vias 126 and conductive lines 127) embedded in the dielectric layer(s) 122 is formed over the memory device level 14L. Any suitable methods may be employed to form the interconnect level 16L, and the details are not described herein. In some embodiments, the interconnect level 16L is electrically connect the electrical components formed in/on the substrate 101 to form functional circuits. In some embodiments, the interconnect structure 16L is also electrically coupled the memory devices 120, 130 to the active devices 110 and/or the components in/on the substrate 101. In addition, the memory devices 120 and 130 may be electrically coupled to an external circuit or an external device through the structure of the interconnect level 16L. In some embodiments, the memory devices 120 and 130 are electrically coupled to the active devices 110 of the front-end level 12L and/or other electrical components formed in the substrate 101, and are controlled or accessed (e.g., written to or read from) by functional circuits of the semiconductor device 10. Alternatively, the memory devices 120, 130 are electrically coupled to (e.g., controlled or accessed) an external circuit of another semiconductor device through the structure of the interconnect level 16L.

FIG. 2 to FIG. 29 show schematic three-dimensional views of structures produced at various stages of a manufacturing method of a memory device according to some embodiments of the present disclosure. FIG. 30 is a schematic cross-sectional view showing the structure of FIG. 29 along crossline I-I'. According to some embodiments, the memory device may be a three-dimensional (3D) memory device with a ferroelectric material. The memory devices depicted in the following paragraphs may be used as the memory devices 120 and 130 in FIG. 1.

Figure 2:
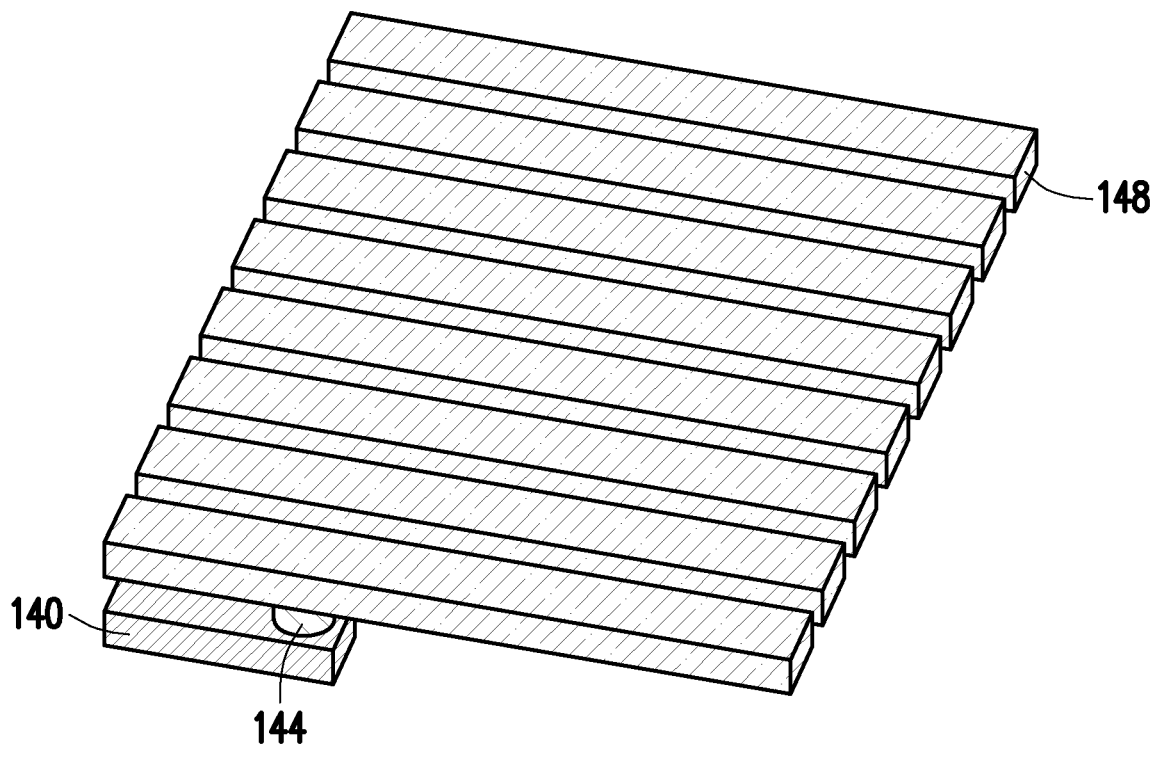

In FIG. 2, a plurality of conductive lines 148 are formed over the front-end level 12L. In some embodiments, the conductive lines 148 is formed on conductive vias 144 to electrically connect to the conductive vias 144 respectively. The conductive vias 144 may be electrically connected to underlying FEOL circuits or device such as conductive lines 140. In some embodiments, the conductive lines 140 are parts of part of the front-end level 12L as described in the previous embodiments. For example, the conductive lines 140 are electrically connected to conductive features such as the conductive lines 114 or the conductive lines 125, or the conductive lines 140 are the conductive lines 114 or the conductive lines 125. The conductive lines 140 may be formed in a dielectric layer 142 (shown in FIG. 29), and the conductive vias 144 may be formed in a dielectric layer 146 (shown in FIG. 29) on the dielectric layer 142. In some embodiments, the conductive lines 140 extend along a first direction D1 (e.g., X direction) and arranged in parallel along a second direction D2 (e.g., Y direction) substantially perpendicular to the first direction D1. The conductive vias 144 are directly formed on the conductive lines 140, that is, the conductive vias 144 are in physical contact with the conductive lines 140, for example. The conductive vias 144 may be formed using a single damascene process. For example, the dielectric layer 146 is patterned utilizing a combination of photolithography and etching techniques with a mask to form openings corresponding to the desired patterns of the conductive vias 144. The openings may respectively expose the conductive lines 140. An optional diffusion barrier and/or optional adhesion layer may be deposited and the openings may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive vias 144 are formed by depositing a seed layer of copper or a copper alloy, and filling the openings by electroplating. A chemical mechanical planarization (CMP) process or the like may be used to remove excess conductive material from a surface of the dielectric layer 146 and to planarize surfaces of the dielectric layer 146 and the conductive vias 144 for subsequent processing. In some embodiments, adjacent conductive vias 144 are not aligned with each other in the second direction. However, the disclosure is not limited thereto. From a top view, the conductive vias 144 may be circular, square, rectangular or ring-shaped.

In some embodiments, the conductive lines 148 are formed in a dielectric layer (not shown) on the conductive vias 144. The conductive lines 148 are directly formed on the conductive vias 144, that is, the conductive lines 148 are in physical contact with the conductive vias 144, for example. In some embodiments, the conductive lines 148 extend along the first direction D1 and arranged in parallel along the second direction D2. The conductive lines 148 may be formed using a single damascene process. For example, the dielectric layer is patterned utilizing a combination of photolithography and etching techniques with a mask to form trenches corresponding to the desired patterns of the conductive lines 148. The trenches expose the conductive vias 144 respectively. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive lines 148 are formed by depositing a seed layer of copper or a copper alloy, and filling the trenches by electroplating. A chemical mechanical planarization (CMP) process or the like may be used to remove excess conductive material from a surface of the dielectric layer and to planarize surfaces of the dielectric layer and the conductive lines 148 for subsequent processing. In some embodiments, the conductive vias 144 and the conductive lines 148 are formed separately. However, the disclosure is not limited thereto. In alternative embodiments, the conductive vias 144 and the conductive lines 148 are formed simultaneously by a dual damascene process. In such embodiments, the conductive vias 144 and the conductive lines 148 are integrally formed in a dielectric layer.

In FIG. 3, an etch stop layer 160 is formed on the conductive lines 148, and a plurality of openings 162 are formed in the etch stop layer 160. In some embodiments, the etch stop layer 160 is formed on the dielectric layer 150 to cover the conductive lines 148. For example, the etch stop layer 160 is in physical contact with surfaces (e.g., entire top surfaces) of the conductive lines 148. The etch stop layer 160 provides etching selectivity for subsequent etching processes. The etch stop layer 160 may include silicon carbide (SiC), silicon carbonitride, metal oxides such as aluminum oxide, or titanium oxide, metal nitrides such as aluminum nitride, titanium nitride, or the combination thereof. The etch stop layer 160 may be formed by a suitable formation method such as atomic layer deposition (ALD), CVD, PVD, or the like. The etch stop layer 160 may be patterned utilizing a combination of photolithography and etching techniques with a mask, to form the openings 162 therein. The openings 162 may be formed by removing portions of the etch stop layer 160 without penetrating through the etch stop layer 160. In alternative embodiments, the openings 162 penetrate through the etch stop layer 160. In some embodiments, the openings 162 are formed at locations where conductive pillars of source lines or bit lines are to be formed. In some embodiments, the openings 162 are arranged in an array. However, the disclosure is not limited thereto.

Figure 4:
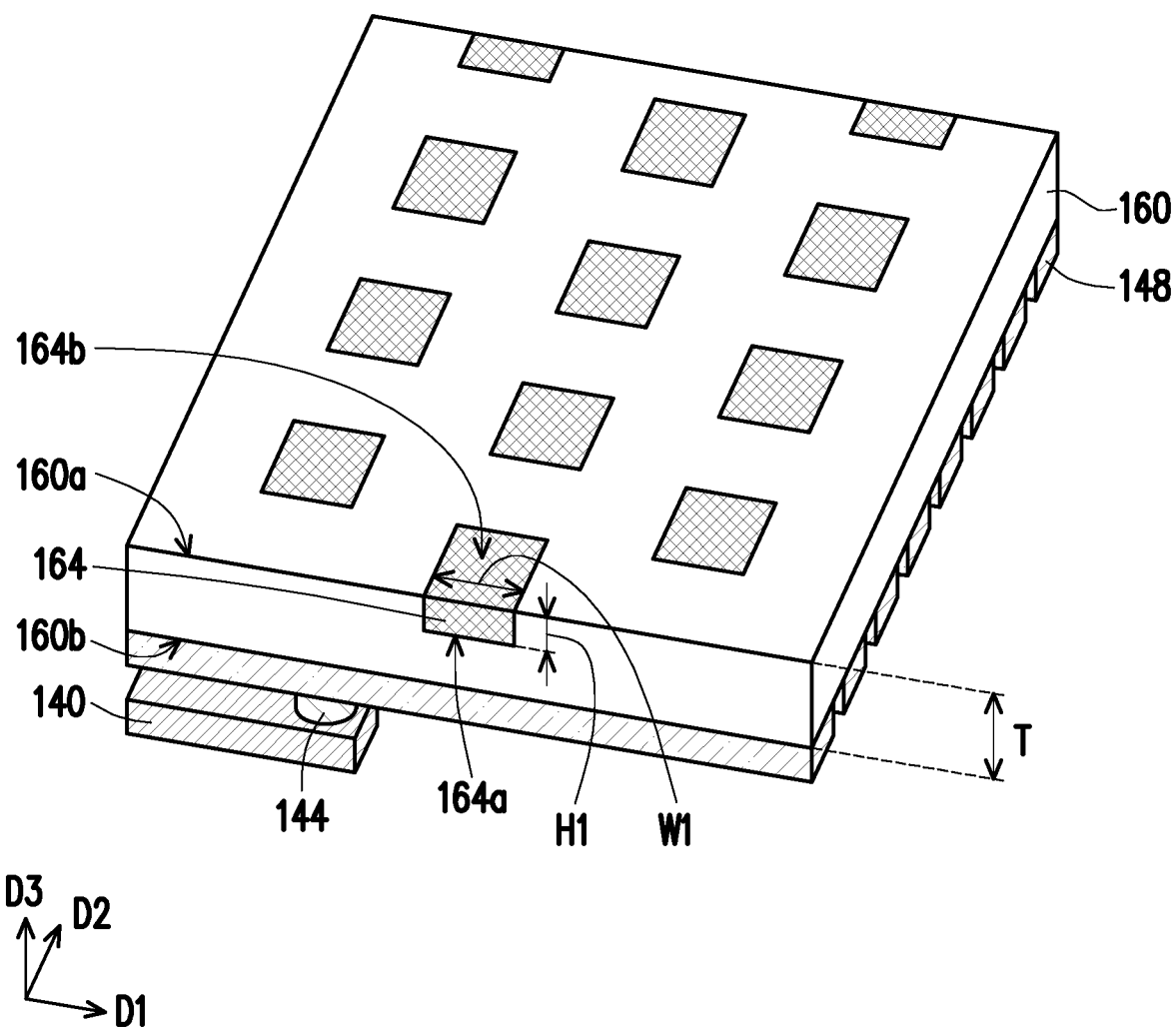

In FIG. 4, a plurality of etch stop patterns 164 are then formed in the openings 162 of the etch stop layer 160 respectively. The etch stop patterns 164 may be formed by a deposition process and a planarization process. Accordingly, surfaces 164a (e.g., top surfaces) of the etch stop patterns 164 are substantially coplanar with a surface 160a (e.g., top surface) of the etch stop layer 160, for example. In some embodiments, materials of the etch stop patterns 164 and the etch stop layer 160 are selected so that they are etched selectively relative each other. In some embodiments, the etch stop patterns 164 include metal oxides such as aluminum oxide, or titanium oxide, metal nitrides such as aluminum nitride, titanium nitride, or the combination thereof. However, other materials are also possible. The etch stop patterns 164 may be formed by a suitable formation method such as atomic layer deposition (ALD), CVD, PVD, or the like. As seen in FIG. 4, the etch stop pattern 164 is formed with a width W1 (along the first direction) and a height H1 (along the third direction). The etch stop layer 160 has opposite surfaces 160a and 160b (e.g., top and bottom surfaces), and the etch stop pattern 164 has opposite surfaces 164a and 164b (e.g., top and bottom surfaces). The height H1 of the etch stop pattern 164 is measured between the surfaces 164a and 164b, and the height H1 may be smaller than or substantially the same as a thickness T (e.g., defined between the surfaces 160a and 160b) of the etch stop layer 160. In some embodiments, the surface 164a (e.g., a top surface) of the etch stop pattern 164 is substantially coplanar with the surface 160a (e.g., a top surface) of the first etch stop layer 160, and the surface 164b of the etch stop pattern 164 is disposed between the opposite surfaces 160a and 160b of the etch stop layer 160. That is, the etch stop pattern 164 may be formed without penetrating the etch stop layer 160. From a top view, the etch stop patterns 164 may be circular, square or rectangular.

Figure 5:
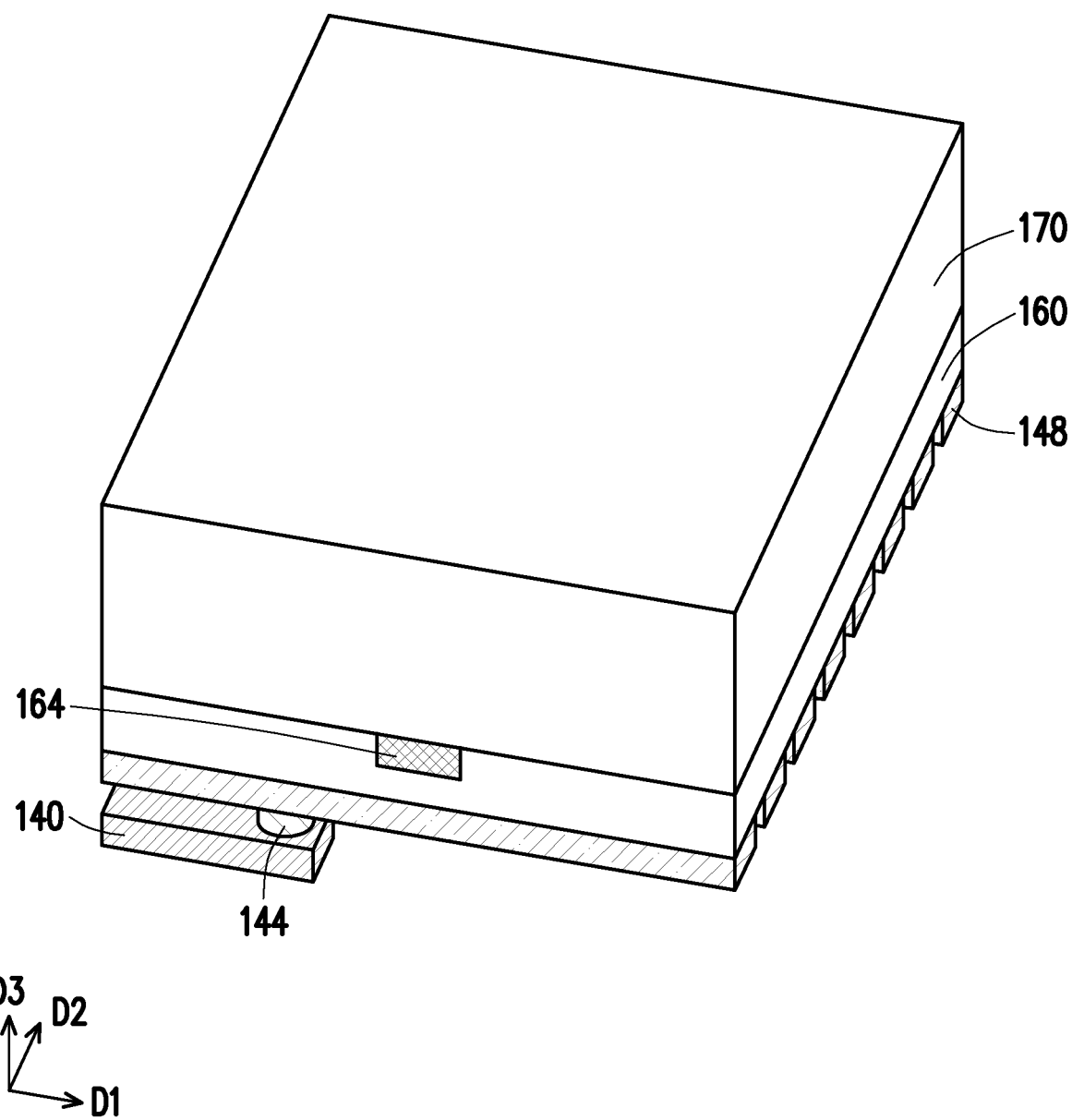

In FIG. 5, an etch stop layer 170 is formed on the etch stop layer 160 and the etch stop patterns 164. In some embodiments, materials of the etch stop layer 170, the etch stop patterns 164 and the etch stop layer 160 are selected so that they are etched selectively relative each other. In some embodiments, the etch stop layer 170 include silicon oxide, silicon nitride, silicon oxynitride, silicon carbide, silicon oxycarbide, silicon carbonitride, or the combination thereof. In some embodiments, the etch stop layer 170 is formed by any compatible formation method, such as CVD, PVD, ALD, or the like.

Figure 6:
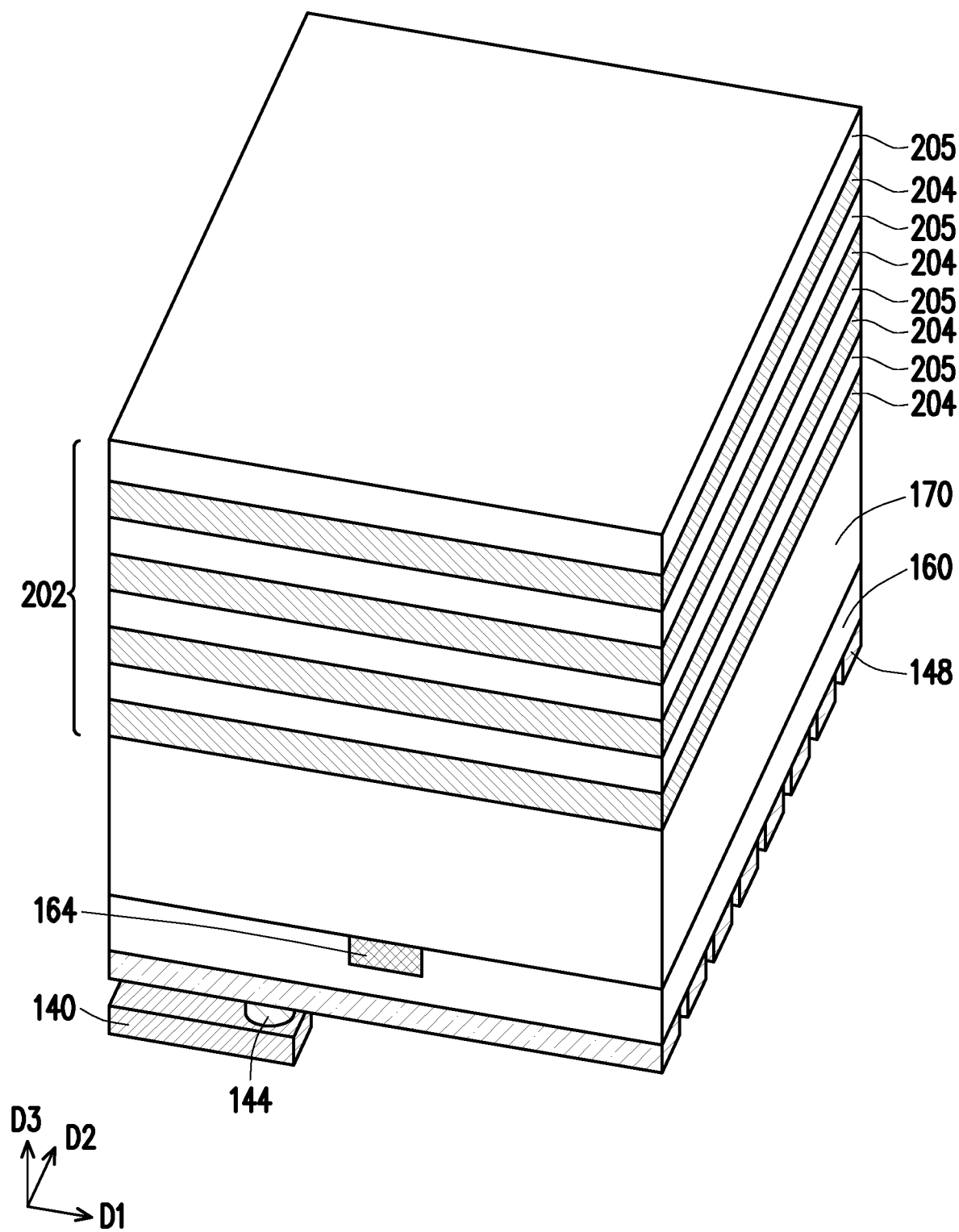

In FIG. 6, a stack 202 is formed on the etch stop layer 170. In some embodiments, the stack 202 is a stack of multiple alternating dielectric layers and may also be referred to as a multilayered stack. In some embodiments, the multilayered stack 202 includes alternating dielectric layers 204 and dielectric layers 205 along a third direction (e.g., Z direction). In some embodiments, the dielectric materials for forming the dielectric layers 204 and the dielectric layers 205 include silicon oxide, silicon nitride, silicon oxynitride, silicon carbide, silicon oxycarbide, silicon carbonitride, or the combination thereof. In some embodiments, the dielectric layers 204 and the dielectric layers 205 are formed by any compatible formation method, such as CVD, PVD, ALD, or the like. In FIG. 6, the multilayered stack 202 includes four layers of the dielectric layers 204 and four layers of the dielectric layers 205. It is comprehended that the number of the dielectric layers 204 and the number of the dielectric layers 205 may be any suitable number and may be adjusted based on product design.

In some embodiments, the materials of the dielectric layers 204 are different from the materials of the dielectric layers 205. As the multilayered stack 202 will be patterned and etched in subsequent processes, the dielectric materials of the dielectric layers 204 and the dielectric materials of the dielectric layers 205 are chosen to have high or acceptable etching selectivity between each other or one another. The materials of the dielectric layers 205 may be the same or have similar etching selectivity to the material of the etch stop layer 170. In some embodiments, the dielectric layers 204 are sacrificial layers (or dummy layers), which will be etched off in later processes and replaced with word lines for the memory cells, while the patterned dielectric layers 205 are used as isolation layers for isolating later formed memory cells. In one embodiment, the etch stop patterns 164 is formed of metal oxide, the etch stop layer 170 and the dielectric layers 205 is formed of silicon oxide, and the dielectric layers 204 are formed of silicon nitride. Other combinations of dielectric materials having acceptable etching selectivity from one another may also be used.

Figure 7:
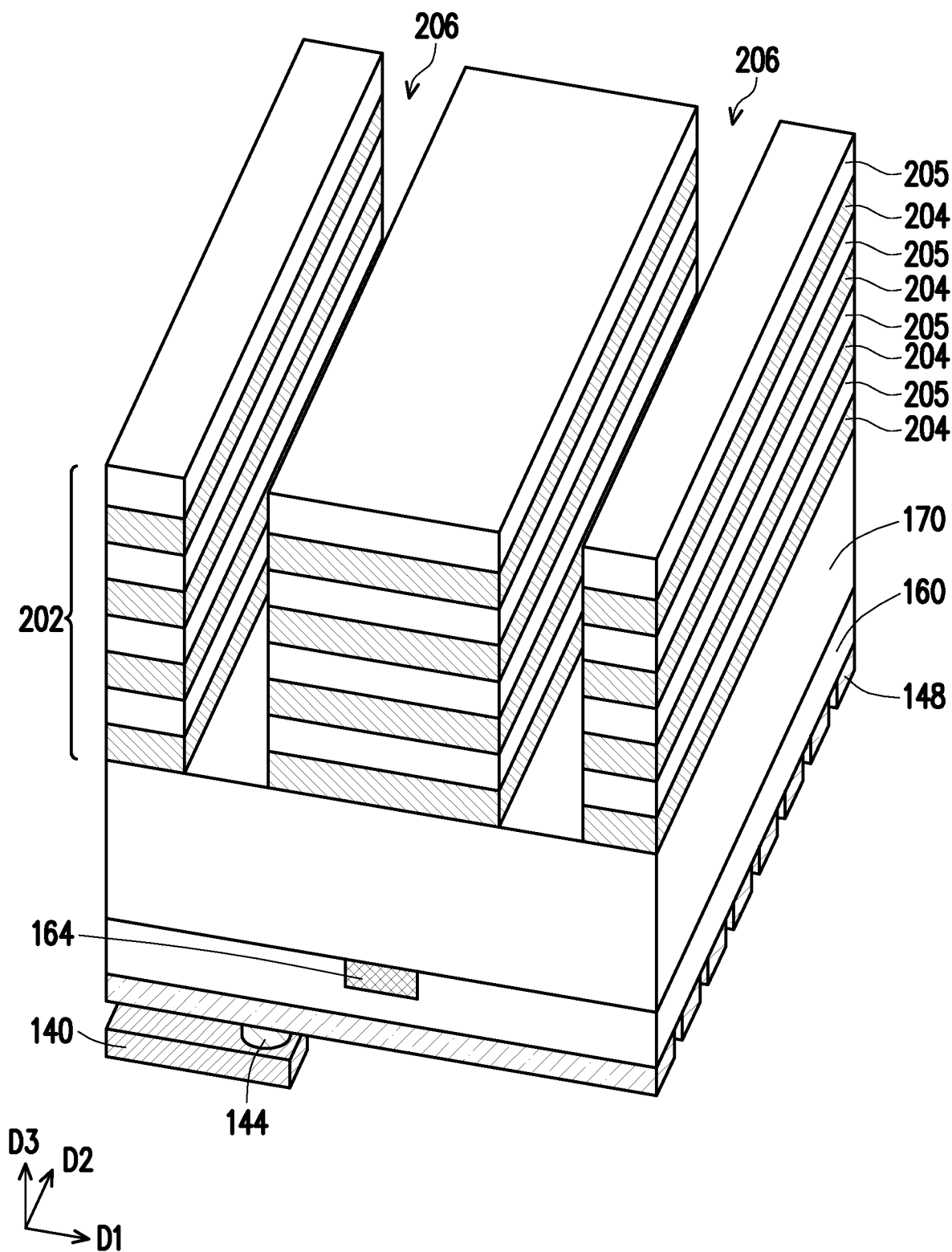

Referring to FIG. 7, a trench forming process is performed and first trenches 206 are formed in the multilayered stack 202. In some embodiments, the trenches 206 are trenches extending in parallel along the second direction. For example, the first trenches 206 penetrate through four dielectric layers 204 and four dielectric layers 205 (counted from the top) and expose the etch stop layer 170. In other embodiments, the first trenches 206 further penetrate through the etch stop layer 170 and expose the etch stop layer 160. The formation of the first trenches 206 involves using photolithographic and etching techniques, such as using a time-controlled etching process so as to stop at the etch stop layer 170. For example, the etch process includes a dry etching process such as reactive ion etch (RIE) process. In some embodiments, the dielectric layers 205 are formed of silicon oxide, and the dielectric layers 204 are formed of silicon nitride, and the first trenches 206 are formed using an anisotropic etching process such as a dry etching process with fluorine-based reactants. In one embodiment, the etch process includes a RIE process using reactants including $CF_4$, $CHF_3$, $CCl_4$, $CHCl_3$, $F_2$, $Cl_2$, $H_2$, $C_4F_8$, Ar, He or mixtures thereof. Although sidewalls of the first trenches 206 are shown as straight vertical sidewalls, the sidewalls may have sloped profiles, or concave or convex surfaces. The aspect ratio of the first trenches 206 and the separation distance of the first trenches 206 are finely selected to allow the subsequently formed memory array having acceptable memory cell density.

Figure 8:
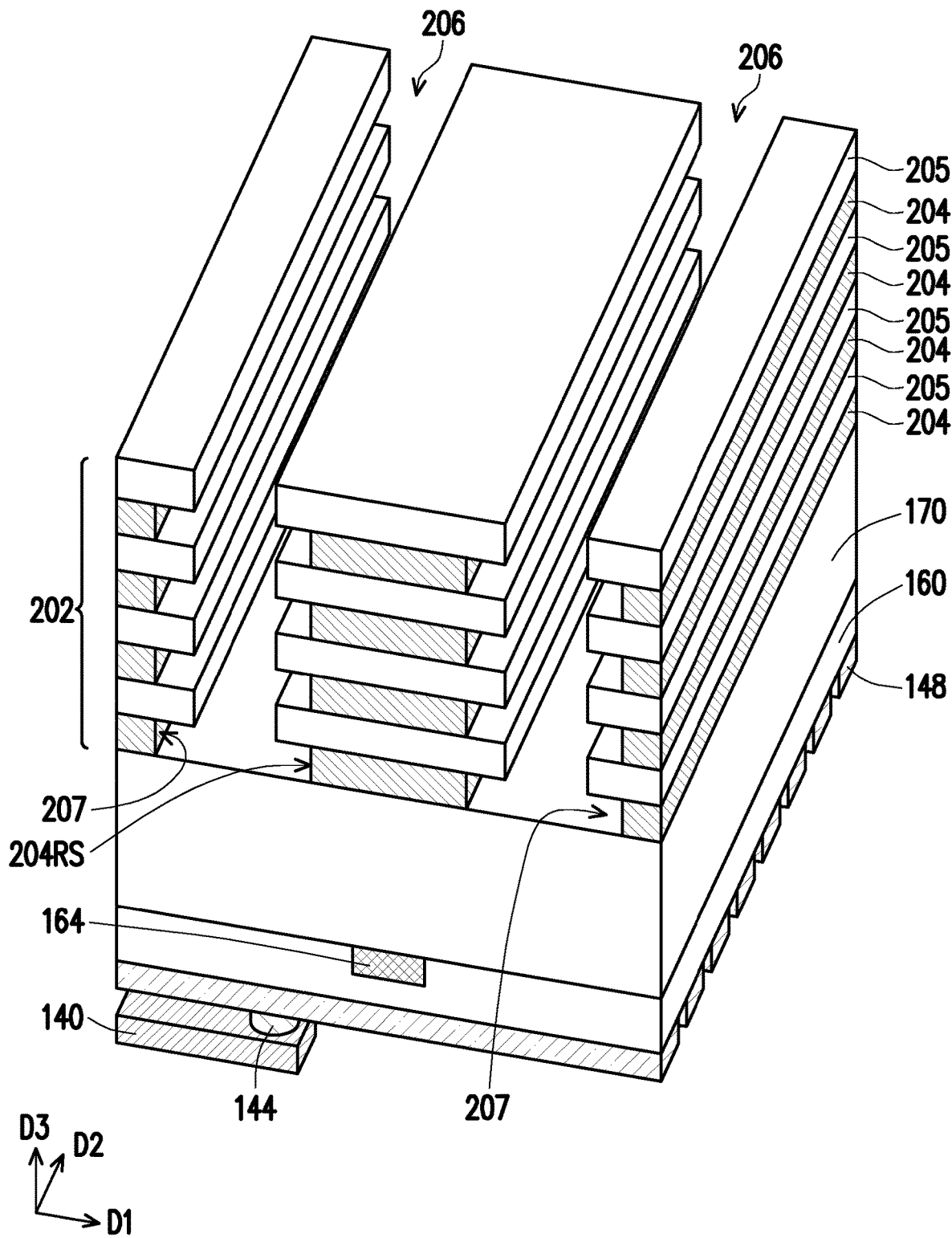

Referring to FIG. 8, an etching process is performed to remove portions of the dielectric layers 204 from their sidewalls exposed by the first trenches 206. That is, the dielectric layers 204 are laterally recessed. In some embodiments, the recessed sidewalls 204RS of the dielectric layers 204 are recessed from the sidewalls of the dielectric layers 205 to form first sidewall recesses 207. The etching process may include an isotropic or an anisotropic etching process, which selectively etches the material of the dielectric layers 204 at a faster rate than the material of the dielectric layers 205. In some embodiments, the etching process may be isotropic, and a wet etching process using phosphoric acid may be performed to form the concave first sidewall recesses 207. In another embodiment, a dry etch process highly selective to the material of the dielectric layers 204 may be used.

Figure 9:
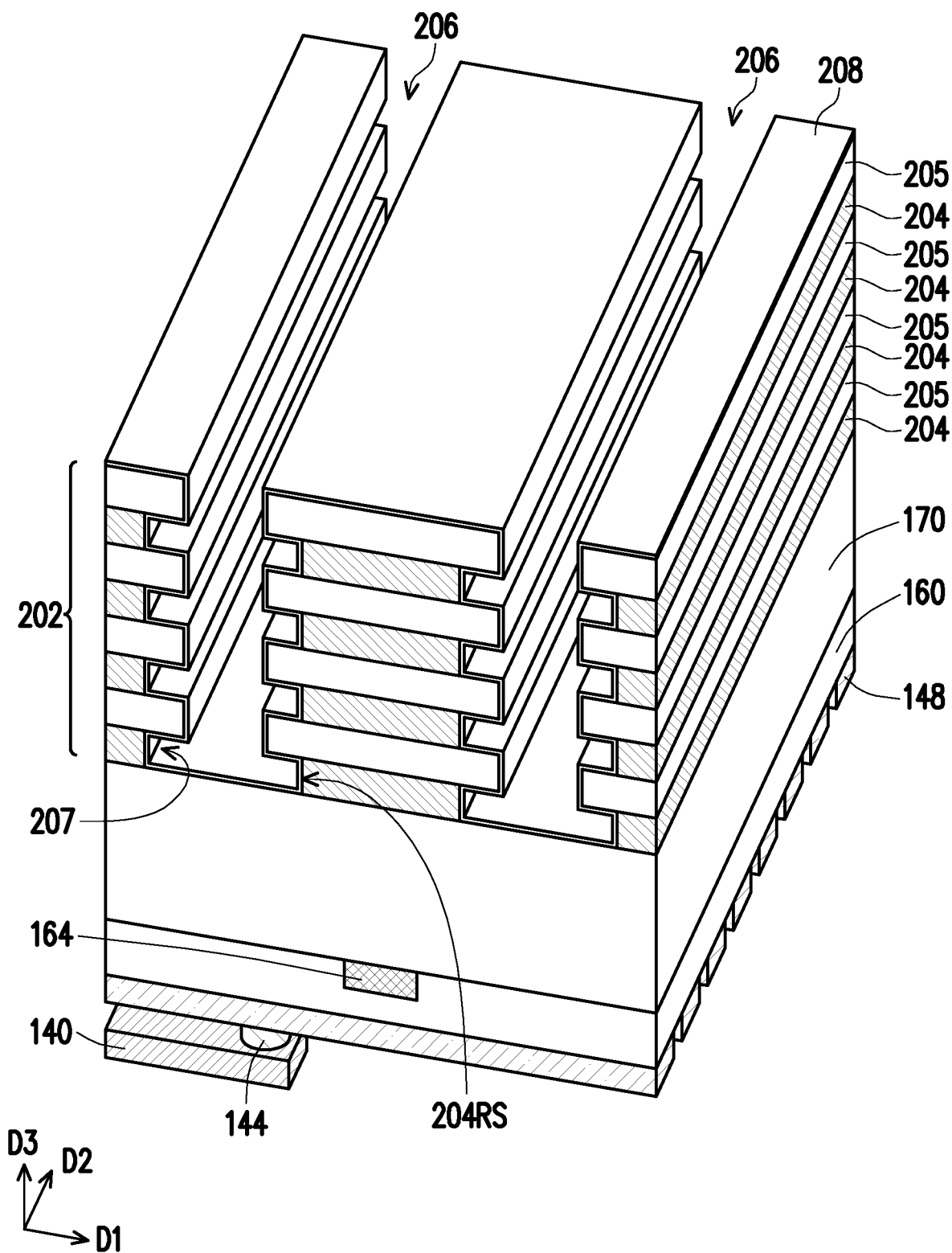

Referring to FIG. 9, a seed layer 208 is formed over exposed surfaces of the first trenches 206 covering the etch stop layer 170. In some embodiments, the seed layer 208 is conformally formed over the first trenches 206 and the first sidewall recesses 207, so that the seed layer 208 directly covers the topmost and bottommost dielectric layers 205 and the sidewalls of the dielectric layers 205, and covers the recessed sidewalls 204RS of the dielectric layers 204 without filling up the first sidewall recesses 207. In some embodiments, the seed layer 208 is formed of an electrically conductive material such as a metal nitride, e.g., titanium nitride, tantalum nitride, molybdenum nitride, zirconium nitride, hafnium nitride, or the like, and may be formed using CVD, ALD, or the like. In some embodiments, the material of the seed layer 208 includes titanium nitride or tantalum nitride.

Figure 10:
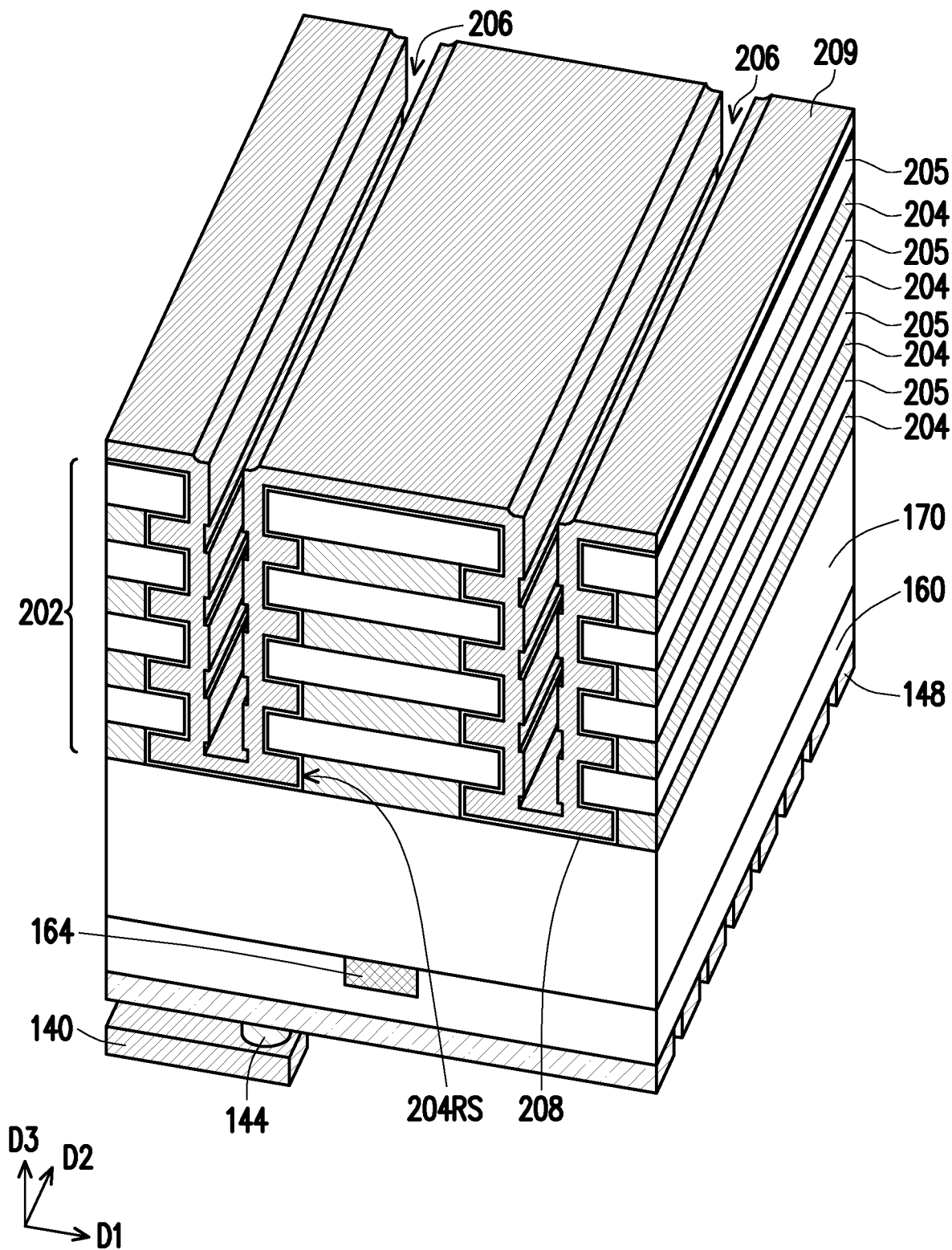

Referring to FIG. 10, a conductive material layer 209 is formed over the seed layer 208. In some embodiments, the material of the conductive material layer 209 includes metals such as tungsten, ruthenium, molybdenum, cobalt, aluminum, nickel, copper, silver, gold, or alloys thereof, or the combinations thereof. In some embodiments, the material of the conductive material layer 209 includes tungsten. The conductive material layer 209 may be formed by a suitable deposition method, such as CVD, PVD, ALD, or the like. In some embodiments, the conductive material layer 209 at least fills the first sidewall recesses 207 but not filling up the first trenches 206.

Figure 11:
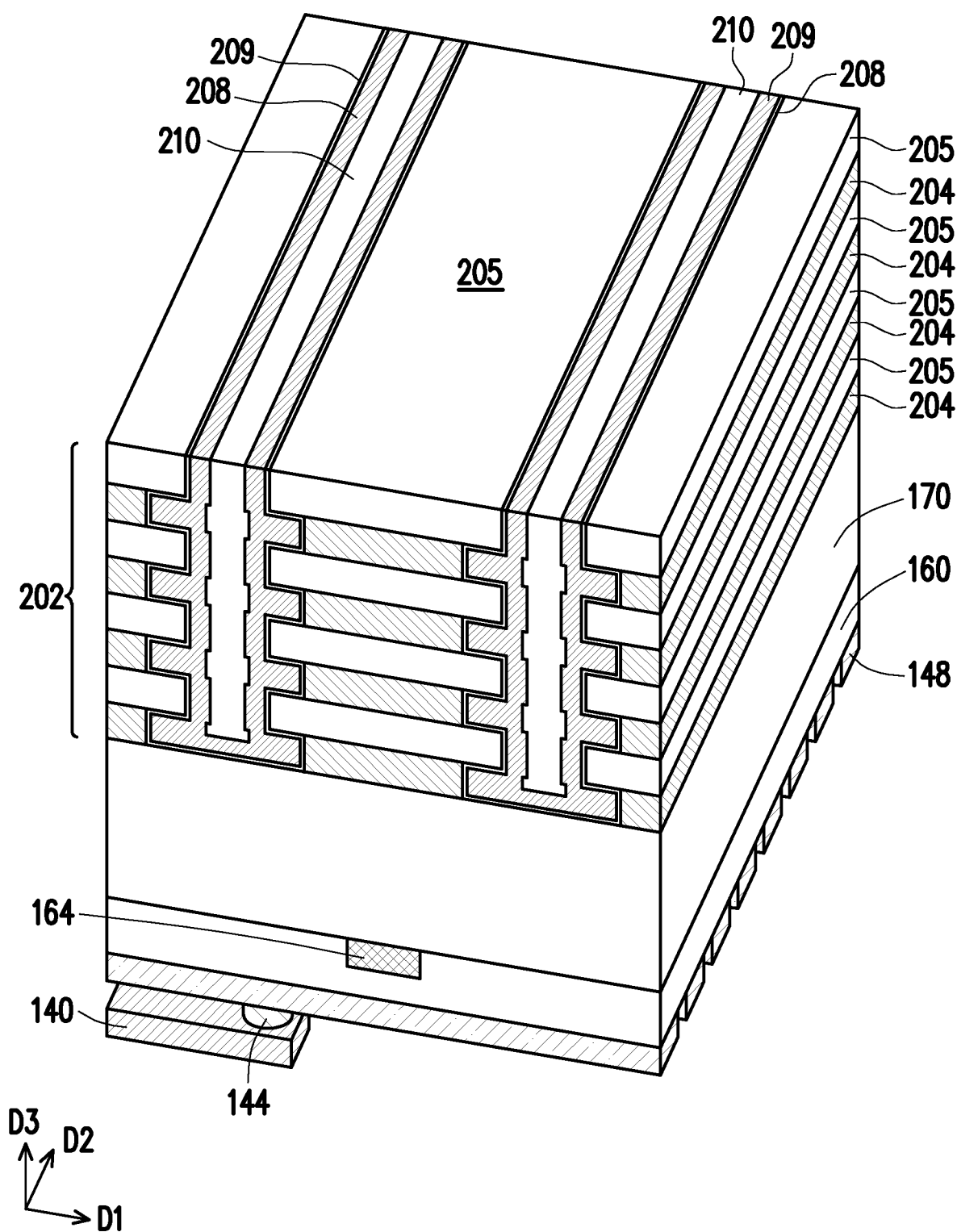

Referring to FIG. 11, dielectric layers 210 are formed on the conductive material layer 209 and filling up the first trenches 206. The formation of the dielectric layers 210 involves forming a dielectric material (not shown) over the conductive material layer 209 and filling the first trenches 206 and then performing a planarization process to remove the extra dielectric material, the conductive material layer 209 and the seed layer 208 above the topmost dielectric layer 205 so as to form fin-shaped dielectric strips respectively in the first trenches 206. In some embodiments, the material of the dielectric layers 210 is the same as the material of the dielectric layers 205. In some embodiments, the material of the dielectric layers 210 is different from the material of the dielectric layers 205. In some embodiments, the dielectric layers 210 is formed by any compatible formation method, such as CVD, PVD, ALD, or the like. In some embodiments, the planarization process includes a chemical mechanical polishing (CMP) process, an etching-back process or a combination thereof.

Figure 12:
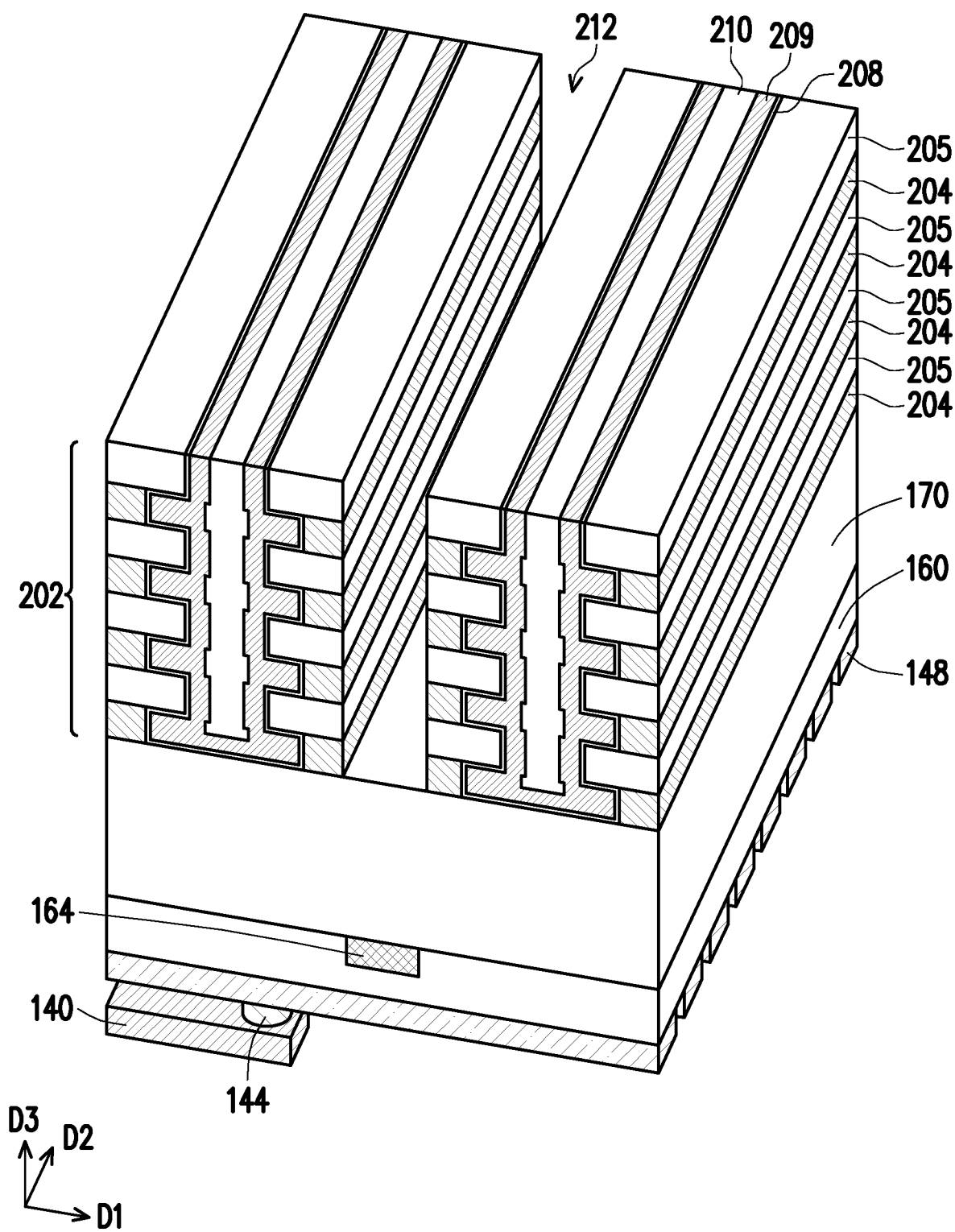

Referring to FIG. 12, another trench forming process is performed and second trenches 212 (only one is shown in FIG. 12) are formed in the stack 202 between the dielectric layers 210 in the first trenches 206 (see FIG. 11). In some embodiments, the trenches 212 are trenches extending in parallel, and the configurations of the second trenches 212 are similar to those of the first trenches 206. As seen in FIG. 12, the second trench 212 penetrates through four dielectric layers 205 and four dielectric layers 204 (counted from the top) and expose the etch stop layer 170. The formation of the trenches 212 may involve similar techniques and process used for forming the trenches 206, and the details will not be repeated herein. In other embodiments, the trenches 212 penetrate through the whole multilayered stack 202 and expose the etch stop layer 170.

Figure 13:
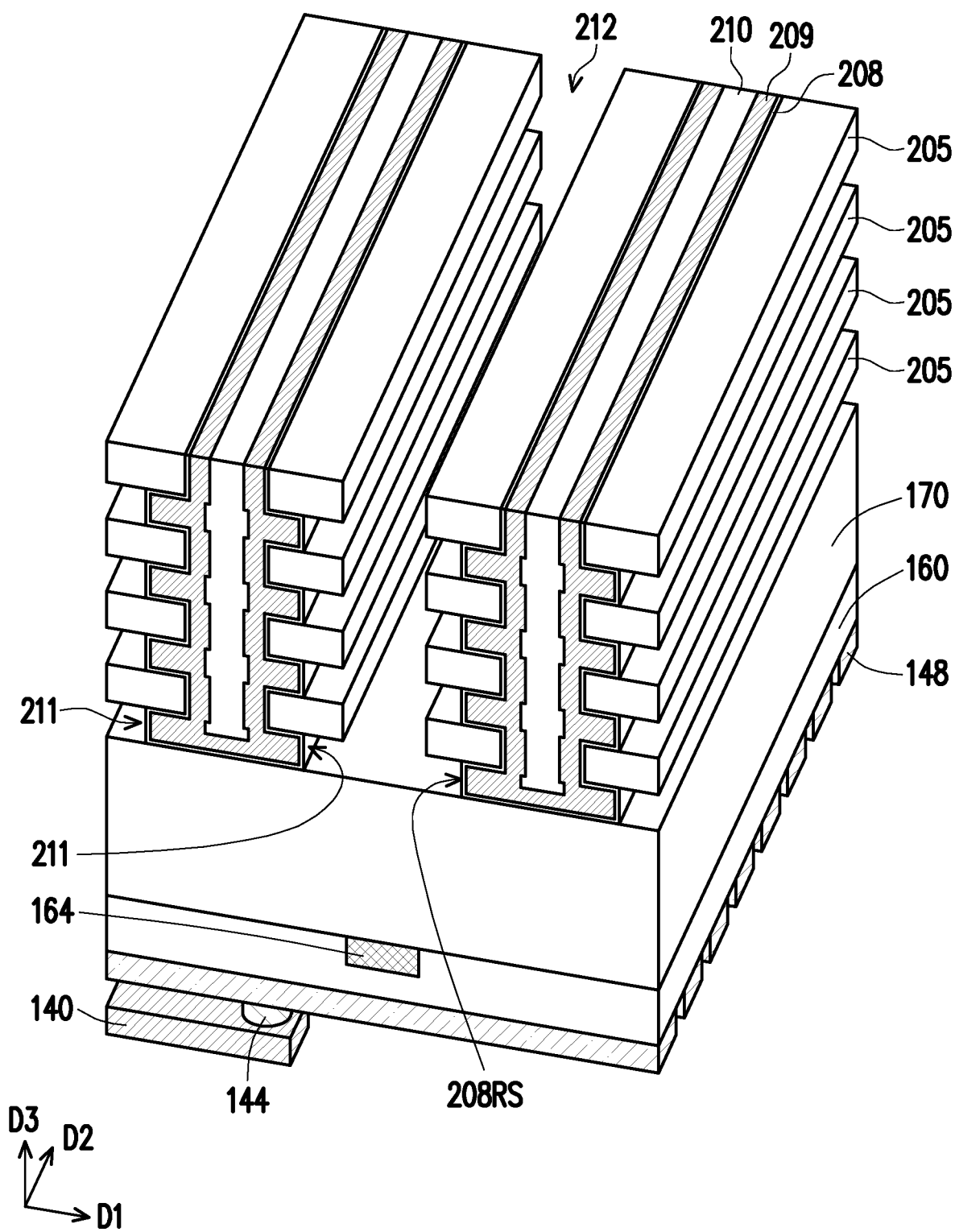

Referring to FIG. 13, in some embodiments, an etching process is performed to remove portions of the dielectric layers 204 from their sidewalls exposed by the second trench(es) 212. That is, the dielectric layers 204 are laterally etched until the seed layer 208 is exposed. In some embodiments, after etching off the remaining dielectric layer 204, second sidewall recesses 211 are formed between the protruded portions of the dielectric layer 205 and the sidewalls 208RS of the seed layer 208 are exposed. The etching process may include an isotropic or an anisotropic etching process, which selectively etches the material of the dielectric layers 204 at a faster rate than the material of the dielectric layers 205. In some embodiments, the etching process is similar to the etching process described in FIG. 8, and such etching process stops at the seed layer 208. In general, the dielectric layers 204 are completely removed without remaining residues.

Figure 14:
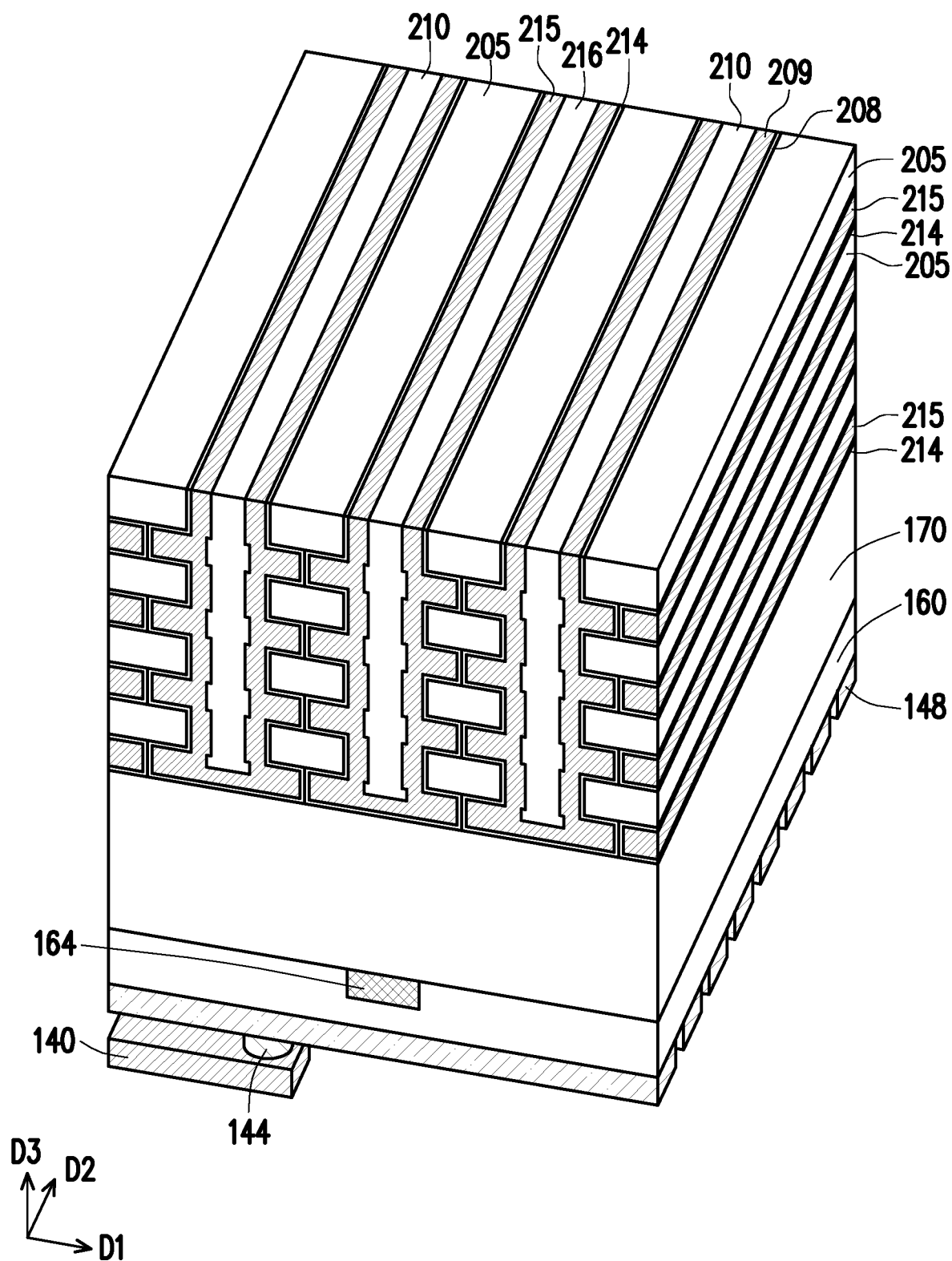

Referring to FIG. 14, a seed layer 214 is formed over exposed surfaces of the second trench(es) 212 covering the etch stop layer 170. In some embodiments, the seed layer 214 conformally covers the second trench(es) 212 and the second sidewall recesses 211, so that the seed layer 214 conformally covers the protruded portions of the dielectric layers 205, and covers the sidewalls 208RS of the seed layer 208 without filling up the second sidewall recesses 211. Later, a conductive material layer 215 is formed over the seed layer 214. In some embodiments, the conductive material layer 215 at least fills the second sidewall recesses 211 but not filling up the second trench(es) 212. In some embodiments, a dielectric layer 216 is later formed on the conductive material layer 215 and filling up the second trench 212. In some embodiments, the dielectric layer 216 is formed as a fin-shaped dielectric strip individually located in the second trench 212. In some embodiments, the material of the dielectric layer 216 is the same as the material of the dielectric layer 210 or the material of the dielectric layers 205. The formation of the seed layer 214, the conductive material layer 215 and the dielectric layer 216 involves similar methods and materials used for forming the seed layer 208, the conductive material layer 209 and the dielectric layer 210 described from FIG. 9 to FIG. 11, and the details will be skipped herein.

Figure 15:
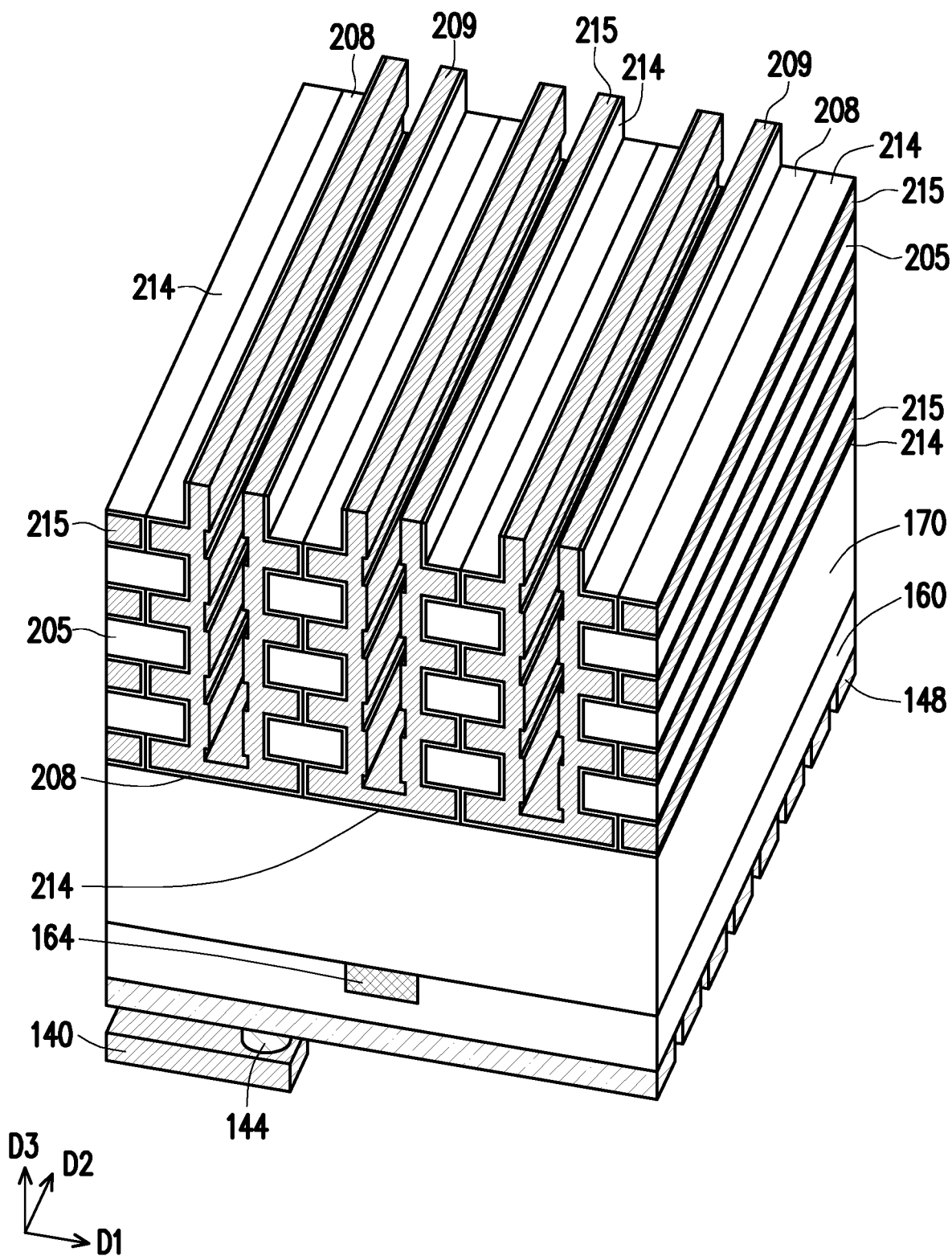

Referring to FIG. 15, a pulling back process is performed to remove the dielectric layers 210 and 216. In some embodiments, the dielectric layers 210 and 216 within the trenches 206 and 212 are removed to expose the conductive material layers 209 and 215. Also, the topmost dielectric layer 205 is removed during the pulling back process. In some embodiments, the pulling back process including a suitable etching process to remove the exposed dielectric layer 205 (i.e. the topmost first dielectric layer), so that the seed layers 208 and 214 are exposed. The etching process may include an isotropic or an anisotropic etching process, which selectively etches the material of the dielectric layers 205 and/or the material of the dielectric layer 210 and 216, and such etching process stops at the seed layers 208, 214 and the conductive material layers 209 and 215.

Figure 16:
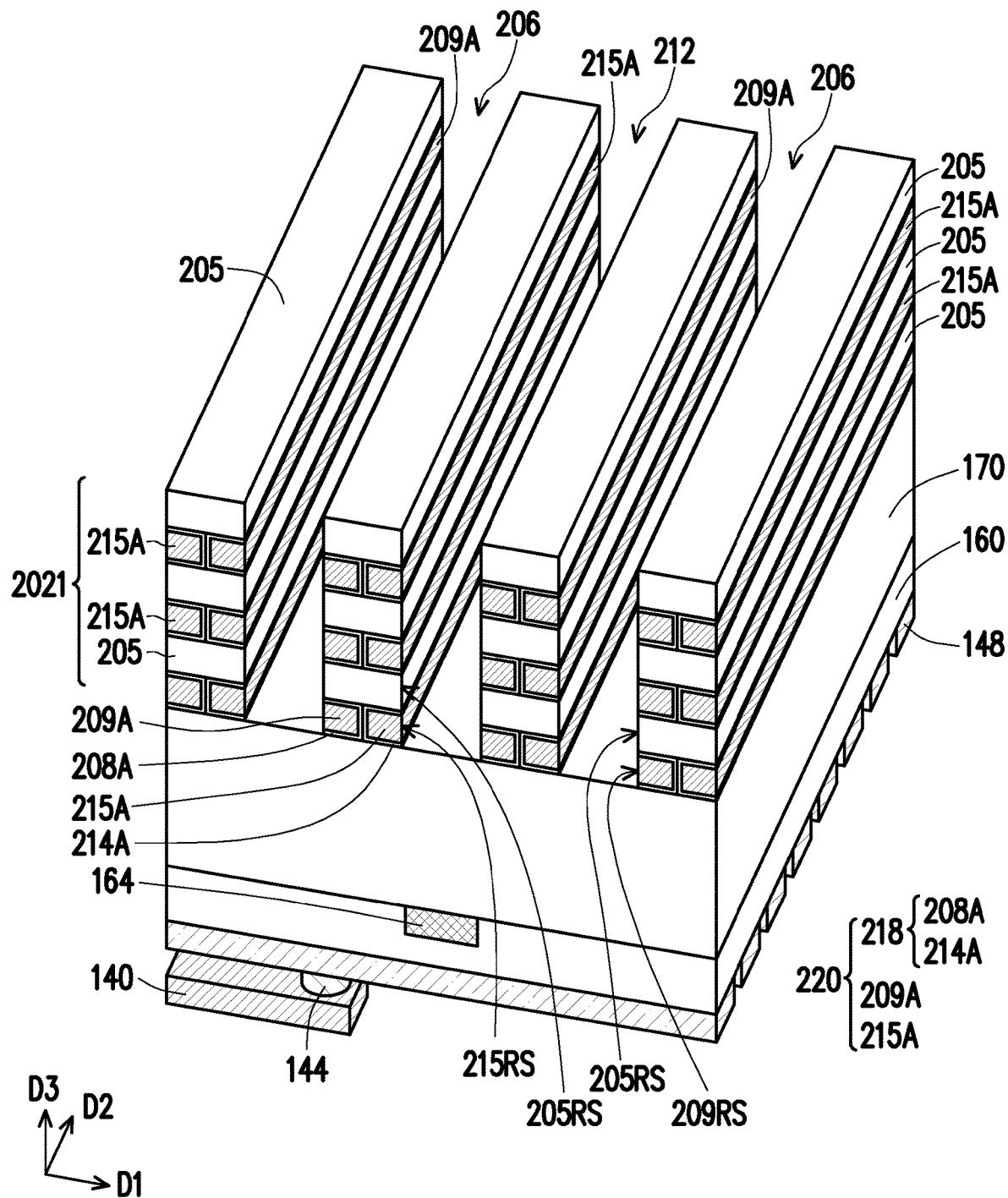

Referring to FIG. 16, a patterning process is performed to remove the extra seed layers 208 and 214 and the conductive material layers 209 and 215 above the fourth dielectric layer 205 (counted upward from the etch stop layer 170) and beyond the protruded portions of the dielectric layers 205 in the first and second trenches 206 and 212 until the etch stop layer 170 is exposed from the trenches 206 and 212. In FIG. 16, after the patterning process, portions of the seed layers 208 and 214 and portions of the conductive material layers 209 and 215 disposed within the sidewall recesses (or disposed within lateral coverage of the dielectric layers 205) remain and become respectively the seed portions 208A and 214A and conductive portions 209A and 215A, and other portions of the seed layers 208 and 214 and the conductive material layers 209 and 215 (e.g., portions disposed outside the sidewall recesses) are removed through the patterning process. As illustrated in FIG. 16, after patterning, the seed portions 208A/214A extends along three sides (e.g., the top surface, a sidewall, and the bottom surface) of corresponding conductive portions 209A/215A. In some embodiments, the seed portions 208A and 214A are referred to as seed liners 218, while the seed liners 218 and the conductive portions 209A and 215A are referred to as conductive features 220. In FIG. 16, after the patterning process, the sidewalls 209RS and 215RS of the conductive portions 209A and 215A are exposed through the first and second trenches 206 and 212. In some embodiments, the sidewalls 205RS of the dielectric layers 205 are vertically substantially aligned with the sidewalls 209RS and 215RS of the conductive portions 209A and 215A. In some embodiments, the patterning process includes performing one or more etching processes. In some embodiments, the patterning process involve using suitable photolithography and etching techniques, such as performing an anisotropic etching process using a mask and followed by a planarization process (such as CMP). Herein, the trenches formed during the patterning process are major trenches but may be referred to as the trenches 206 and 212, it is because these trenches have the similar dimensions and locations of the first and second trenches 206 and 212 in this embodiment. The formation of these trenches involves using photolithographic and etching techniques, such as using a time-controlled etching process so as to stop at the etch stop layer 170. For example, the etch process includes a dry etching process such as a RIE process.

The above-described processes may be regarded the replacement process for replacing the dielectric layers 204 with the conductive features 220, and the conductive features 220 may function as word lines of the memory device. In FIG. 16, four stacks 2021 are shown located on the etch stop layer 170 and these stacks 2021 are separated by the major trenches (i.e., first and second trenches 206 and 212), but the number of the stacks 2021 depends on the number of the trenches and may vary depending on the layout design. Although the four stacks 2021 are shown with straight sidewalls, it is understood that the sidewall profiles may be slanted or slightly curved. In FIG. 16, each multilayered stack 2021 includes three layers of the dielectric layers 205 and three layers of the composite structure of the conductive features 220 which are alternately sandwiched between the dielectric layers 205. It is comprehended that the number of the dielectric layers 205 and the layer number of the conductive features 220 may be any suitable number and may be adjusted based on product design. In some embodiments, the conductive features 220 have a same or similar overall thickness as the dielectric layers 204, and have a width the same with or similar to the lateral depth of the sidewall recesses 207.

Figure 17:
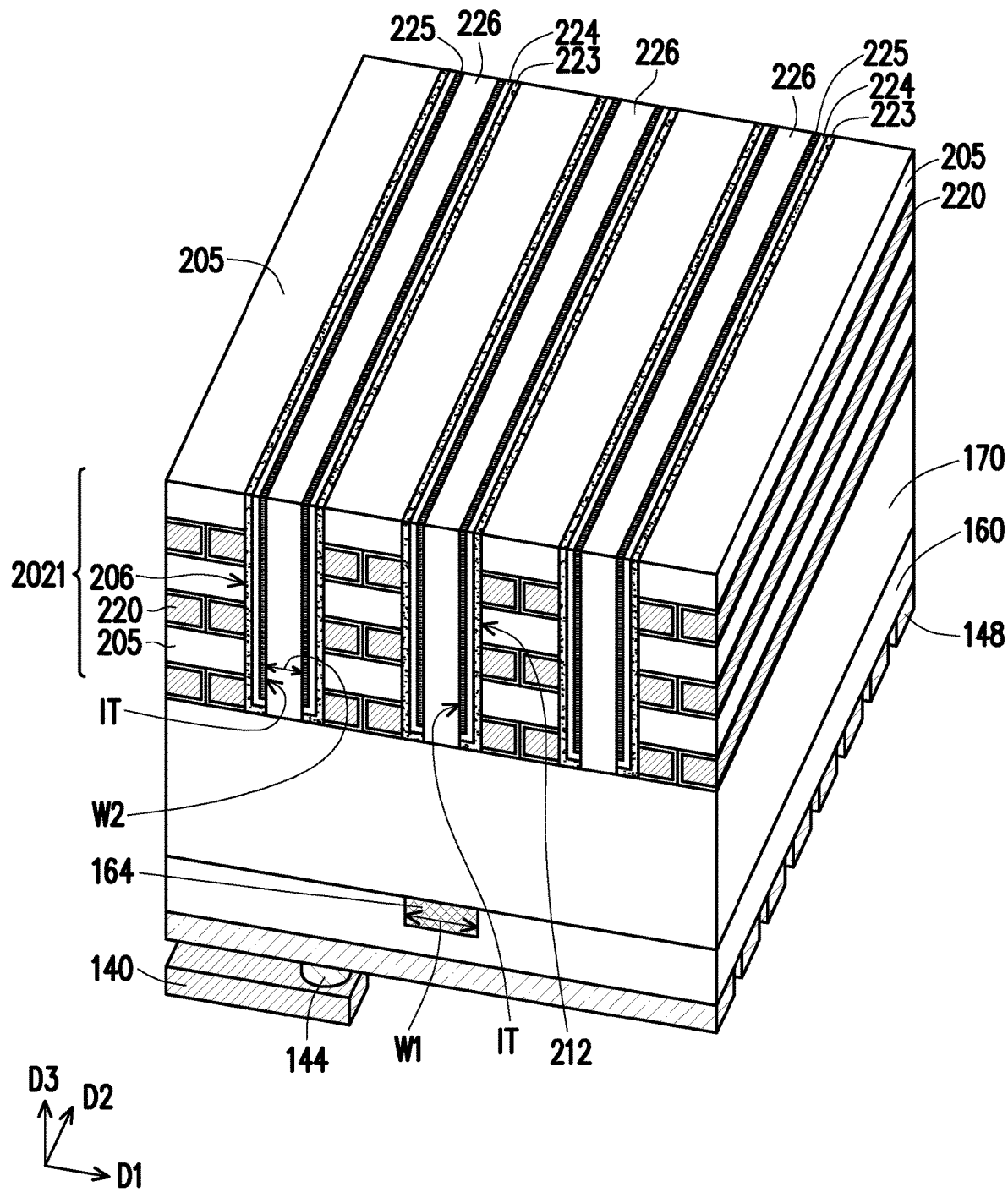

Referring to FIG. 17, in some embodiments, a memory material layer 223 is formed on the sidewalls and bottoms of the trenches 206 and 212, a channel material layer 224 is formed over the memory material layer 223 and a gate dielectric layer 225 is formed over the channel material layer 224, and then a dielectric layer 226 is formed to fill the trenches 206 and 212. In some embodiments, the formation process involves forming a ferroelectric material (not shown) conformally to line the sidewalls and bottoms of the trenches 206 and 212, forming a channel material (not shown) conformally over the ferroelectric material, forming a gate dielectric material (not shown) conformally over the channel material, patterning the ferroelectric material, the channel material and the gate dielectric material to form inner trenches IT and to expose the etch stop layer 170, and then a dielectric material (not shown) is formed to fill up the inner trenches IT. In some embodiments, the inner trenches IT have a width W2 (along the first direction DO not larger than the width W1 of the etch stop patterns 164. However, the disclosure is not limited thereto. Through the formation of the inner trenches IT, the later filled dielectric layers 226 physically split up the sequentially formed ferroelectric material, channel material and gate dielectric material into two parts (i.e. left and right parts located respectively on left and right sidewalls of the trenches 206, 212). Afterwards, a planarization process, such as a CMP process, may be performed to remove excess portions of the ferroelectric material, the channel material, the gate dielectric material and the dielectric material from the upper surfaces of the multilayered stack 202l. As a result, the upper surfaces of the stacks 202l are coplanar with the memory material layer(s) 223, the channel material layer(s) 224, the gate dielectric layer(s) 225 and the dielectric layer(s) 226. In some embodiments, as depicted in FIG. 17, the memory material layer 223, the channel material layer 224, the gate dielectric layer 225 located at left side of the dielectric layer 226 are physically separate from the memory material layer 223, the channel material layer 224, the gate dielectric layer 225 located at right side of the dielectric layer 226 in the same trench. In alternative embodiments, depending on the trench depth in the multilayered stack, although the channel material formed in the trench is split up by the later-formed dielectric material but the ferroelectric material formed in the same trench is intact but not split by the dielectric material.

In some embodiments, the memory material layer 223 is ferroelectric material and includes hafnium zirconium oxide (HfZrO), zirconium oxide (ZrO), undoped hafnium oxide (HfO) or HfO doped with lanthanum (La), silicon (Si), aluminum (Al), or the like. In some embodiments, the memory material layer 223 is formed by a suitable deposition process such as ALD, CVD, PVD, or the like. In some embodiments, the channel material of the channel material layer 224 includes zinc oxide (ZnO), indium tungsten oxide (InWO), indium gallium zinc oxide (IGZO), indium zinc oxide (IZO), indium tin oxide (ITO) or zinc tin oxide (ZTO). In some embodiments, the formation of the channel material layer 224 includes performing one or more deposition processes selected from CVD, ALD, and PVD. In some embodiments, the material of the gate dielectric layer 225 includes one or more high-k dielectric materials, such as $ZrO_2$, $Gd_2O_3$, $HfO_2$, $BaTiO_3$, $Al_2O_3$, $LaO_2$, $TiO_2$, $Ta_2O_5$, $Y_2O_3$, STO, BTO, BaZrO, HfZrO, HfLaO, HfTaO, HfTiO, or combinations thereof. In some embodiments, the gate dielectric layer 225 includes one or more materials selected from aluminum oxide, hafnium oxide, tantalum oxide and zirconium oxide. In some embodiments, the formation of the gate dielectric layer 225 includes performing one or more deposition processes selected from CVD (such as, PECVD and laser-assisted CVD), ALD and PVD (such as, sputtering and e-beam evaporation).

In some embodiments, the dielectric layer 226 is formed of one or more acceptable dielectric materials including silicon oxide, silicon nitride, silicon carbide, silicon oxynitride, silicon oxycarbide, silicon carbonitride, or the like. In some embodiments, the material of the dielectric layers 226 is the same as the material of the dielectric layers 205. In some embodiments, the material of the dielectric layers 226 is different from the material of the dielectric layers 205.

Figure 18:
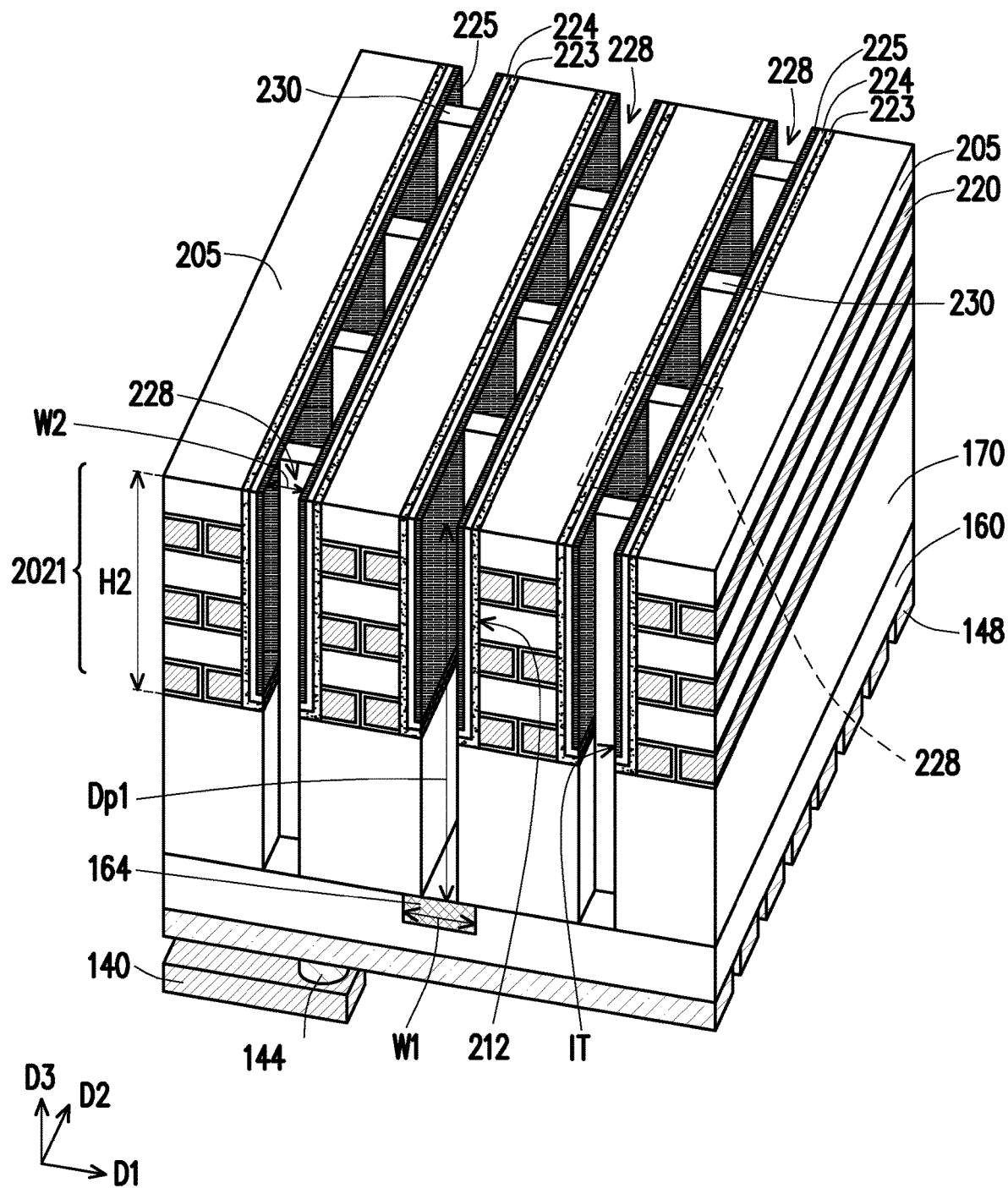

Referring to FIG. 18, an etching process is performed to the dielectric layers 226 to form trench openings 228 in the dielectric layers 226. In some embodiments, the etching process is selective and does not remove the memory material layers 223, the channel material layers 224, and the gate dielectric layers 225. For example, the performed etching process selectively removes the materials of the dielectric layers 226 and the etch stop layer 170 and stops on the etch stop layer 160 and the etch stop patterns 164. In some embodiments, the trench openings 228 vertically extend through the dielectric layers 226 and beyond the stack 202l and penetrate through the etch stop layer 170. The trench openings 228 may be formed with a mask using the same or similar processes for the previous trenches, and thus details are not repeated herein. In some embodiments, each trench opening 228 has a width W2 (along the first direction D0 and a depth Dp1 (along the third direction D3) larger than the height H2 of the stack 202l. In some embodiments, the width W2 is smaller than the width W1 of the etch stop patterns 164 and partially expose the etch stop patterns 164. In alternative embodiments, the width W2 is substantially equal to the width W1 of the etch stop patterns 164, and the sidewalls of the trench openings 228 are substantially flush with the sidewalls of the etch stop patterns 164. The depth Dp1 is substantially the same as a total of the height H2 of the stack 202l and the thickness of the etch stop layer 170.

Figure 19:
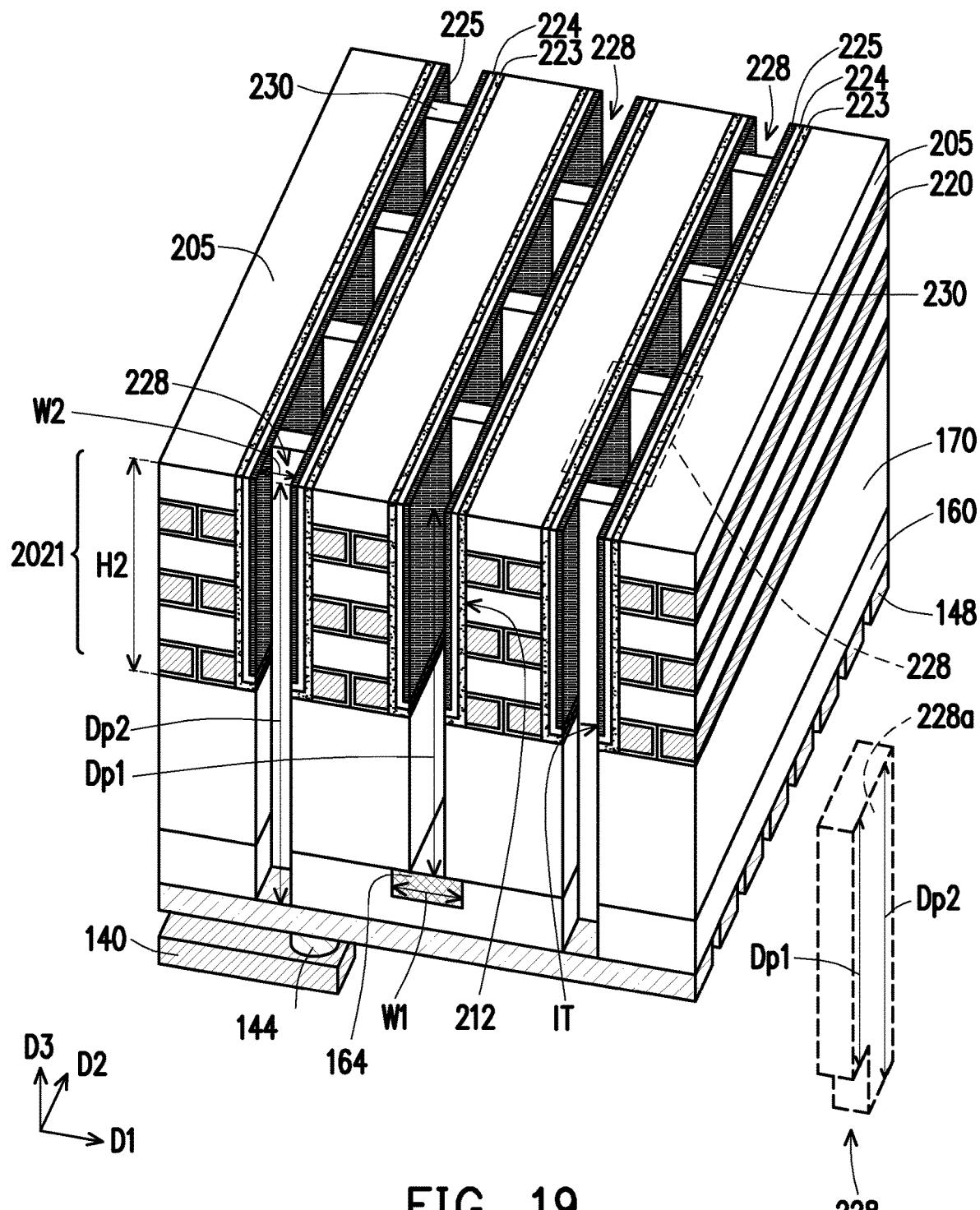

Referring to FIG. 19, an etching process is performed to the etch stop layer 160 to deepen portions 228a of the trench openings 228. In some embodiments, the portions 228a of the trench openings 228 are at locations where conductive pillars of source lines or bit lines are to be formed. For example, the portions 228a of the trench openings 228 are at locations where conductive pillars of bit lines are to be formed. In some embodiments, the etching process is selective and does not remove the etch stop pattern 164, the memory material layers 223, the channel material layers 224 and the gate dielectric layers 225. In some embodiments, the portions 228a of the trench openings 228 vertically extend into the etch stop layer 160 to penetrate through the etch stop layer 160. In some embodiments, the etching process stops at the top of the conductive lines 148. Thus, the portions 228a of the trench openings 228 penetrate through the etch stop layer 170. The performed etching process may selectively remove the materials of the etch stop layer 160 and stop on the conductive lines 148. From the enlarged partial 3D view of a portion (enclosed by the dotted line to represent a cell unit) of the structure as shown at the right side of FIG. 19, it is seen that each trench opening 228 may have a width W2 (along the first direction D1) and two depths Dp1, Dp2 (along the third direction D3) larger than the height of the stack 202l. In some embodiments, inner sidewalls of the etch stop layer 160 are substantially flush with inner sidewalls of the memory material layer 223, the channel material layer 224, the gate dielectric layer 225 and the bottommost dielectric layer 205. The depth Dp1 is substantially equal to a total of the height H2 of the stack 202l and the thickness of the etch stop layer 170, and the depth Dp2 is substantially equal to a total of the height H2 of the stack 202l, the thickness of the etch stop layer 170 and the thickness of the etch stop layer 160. Although sidewalls of the trench openings 228 are shown as straight vertical sidewalls, the sidewalls may have sloped profiles, or concave or convex surfaces. As illustrated in FIG. 19, since the trench openings 228 penetrate through the dielectric layers 226 and the etch stop layer 170, the remained dielectric blocks 230 vertically extend through the stack 202l and the etch stop layer 170. In FIG. 19, each dielectric block 230 is sandwiched between the opposing gate dielectric layers 225 of the corresponding trench, and the dielectric blocks 230 are separate from one another with a distance.

In some embodiments, the trench openings 228 are formed by forming the trench openings and deepening the trench openings with two etching processes. However, the disclosure is not limited thereto. In alternative embodiments, the trench openings are formed by one-step etching process. In such embodiments, the etching process has high or acceptable etching selectivity between the materials of the etch stop layer 160 and the etch stop layer 170 and the materials of the conductive lines 148 and the etch stop patterns 164. Thus, the etching process may simultaneously remove the materials of the etch stop layer 160 and the etch stop layer 170 and stop on the tops of the conductive lines 148 and the etch stop patterns 164.

Figure 20:
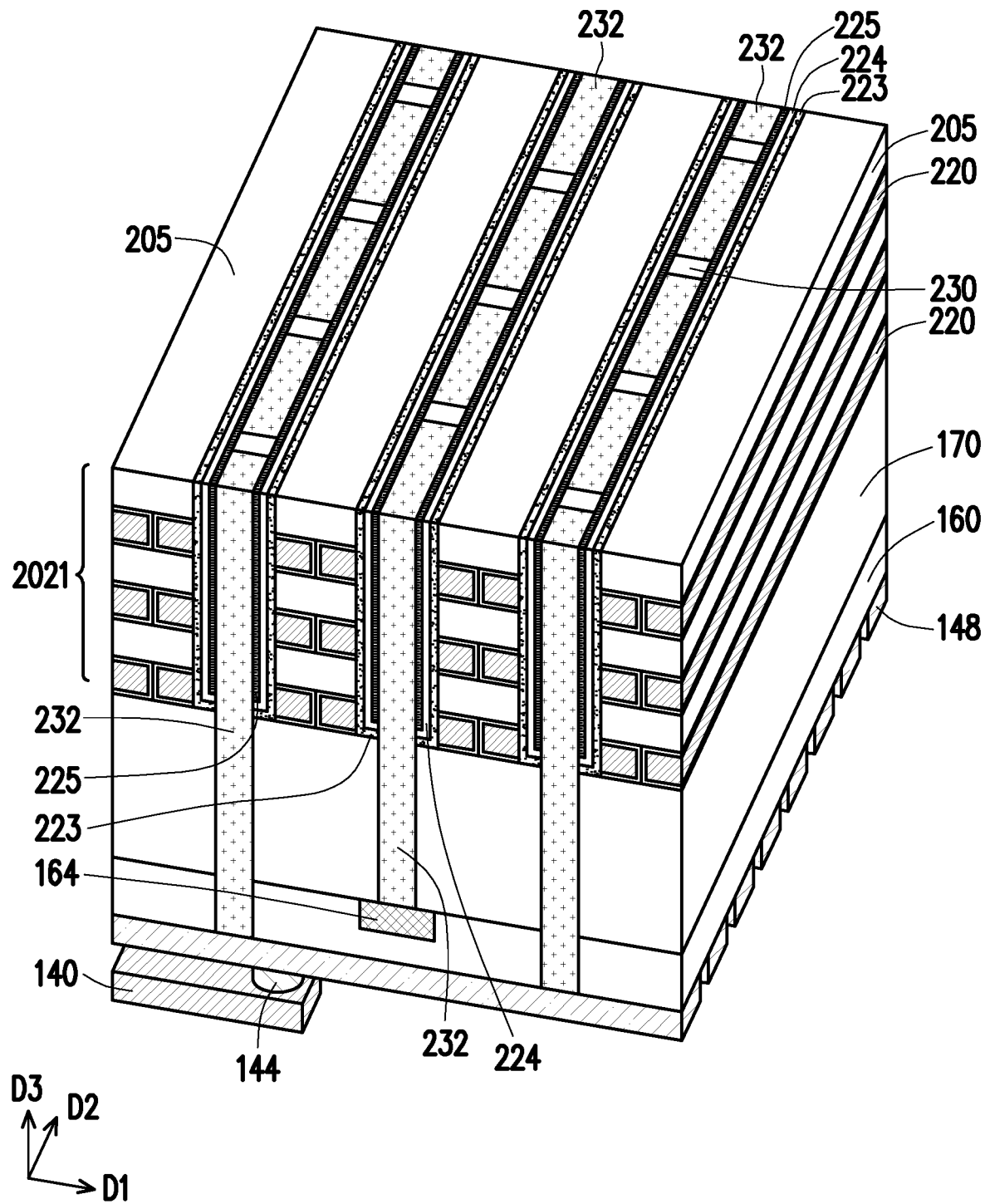

Referring to FIG. 20, insulation layers 232 are formed to fill up the trench openings 228. For example, the formation of the insulation layers 232 involves forming an insulating material over the stacks 2021 and filling up the trench openings 228 and performing a planarization process to remove the extra insulating material outside the trench openings 228. In some embodiments, the material for forming the insulation layer 232 includes silicon oxide, silicon nitride, silicon oxynitride, silicon carbide, silicon oxycarbide, silicon carbonitride, or the combination thereof. In one embodiment, the insulating material of the insulation layers 232 includes silicon nitride. In some embodiments, the insulation layers 232 are formed by any compatible formation method, such as coating, CVD, PVD, ALD or the like.

Figure 21:
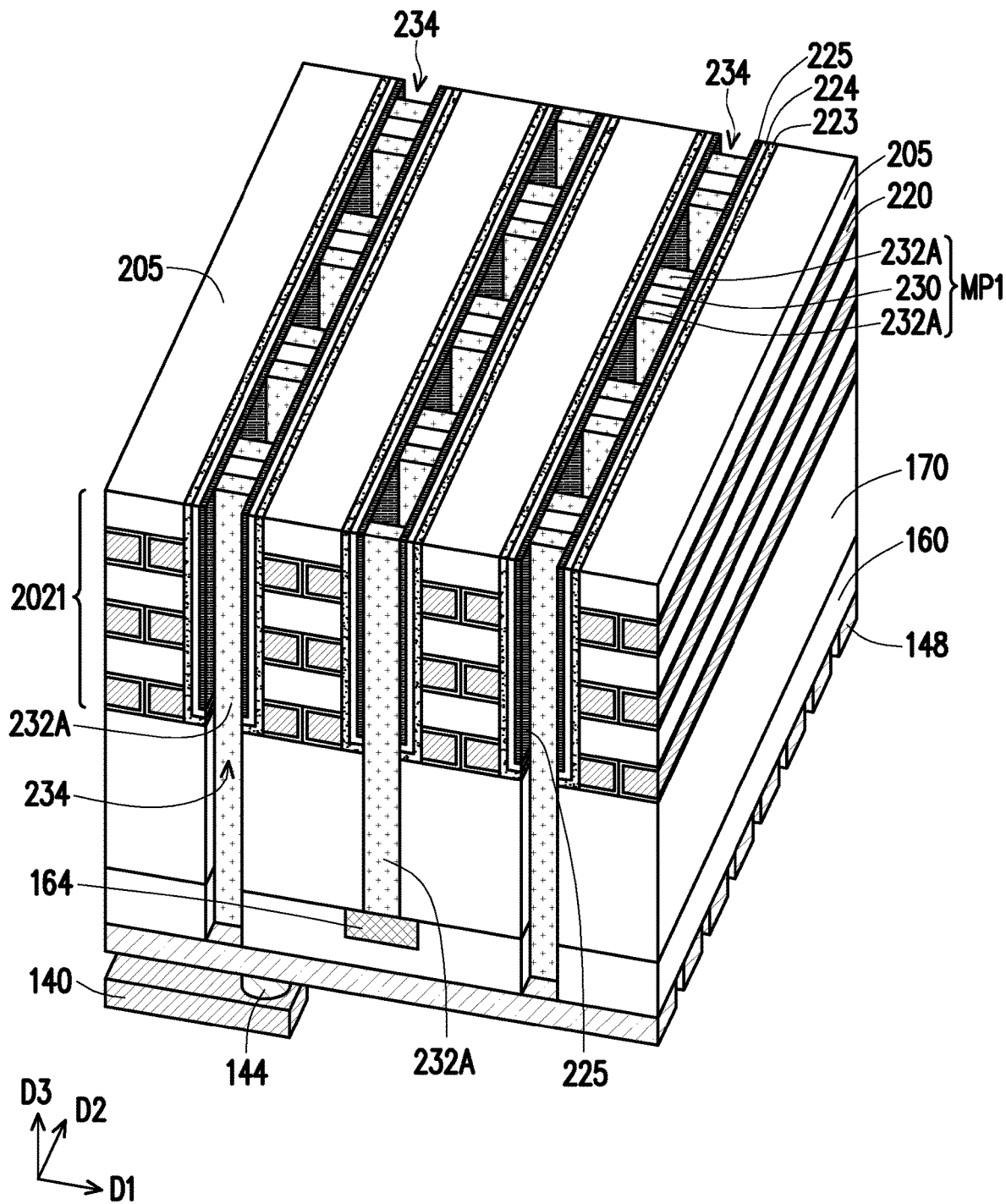

Referring to FIG. 21, an etching process is performed to the insulation layers 232 to form trench openings 234 in the insulation layers 232, and the gate dielectric layers 225 are exposed. In some embodiments, the etching process is selective and does not remove the memory material layers 223, the channel material layers 224 and the gate dielectric layers 225. In some embodiments, the trench openings 234 vertically extend through insulation layers 232 to expose the etch stop patterns 164 or the conductive lines 148. The performed etching process may selectively remove the materials of the insulation layers 232 and stop at the etch stop patterns 164 or the conductive lines 148. The trench openings 234 may be formed using the same or similar processes for the previous trenches, and thus details are not repeated herein. As illustrated in FIG. 21, since the trench openings 234 penetrate through the insulation layers 232 to expose the etch stop patterns 164 or the conductive lines 148, the remained insulation blocks 232A vertically extend along the dielectric blocks 230 to reach the etch stop patterns 164 or the conductive lines 148. In FIG. 21, the insulation blocks 232A are separate from one another with a distance, and each dielectric block 230 is sandwiched between two insulation blocks 232A in the corresponding trench to form a mask pattern MP1.

Figure 22:
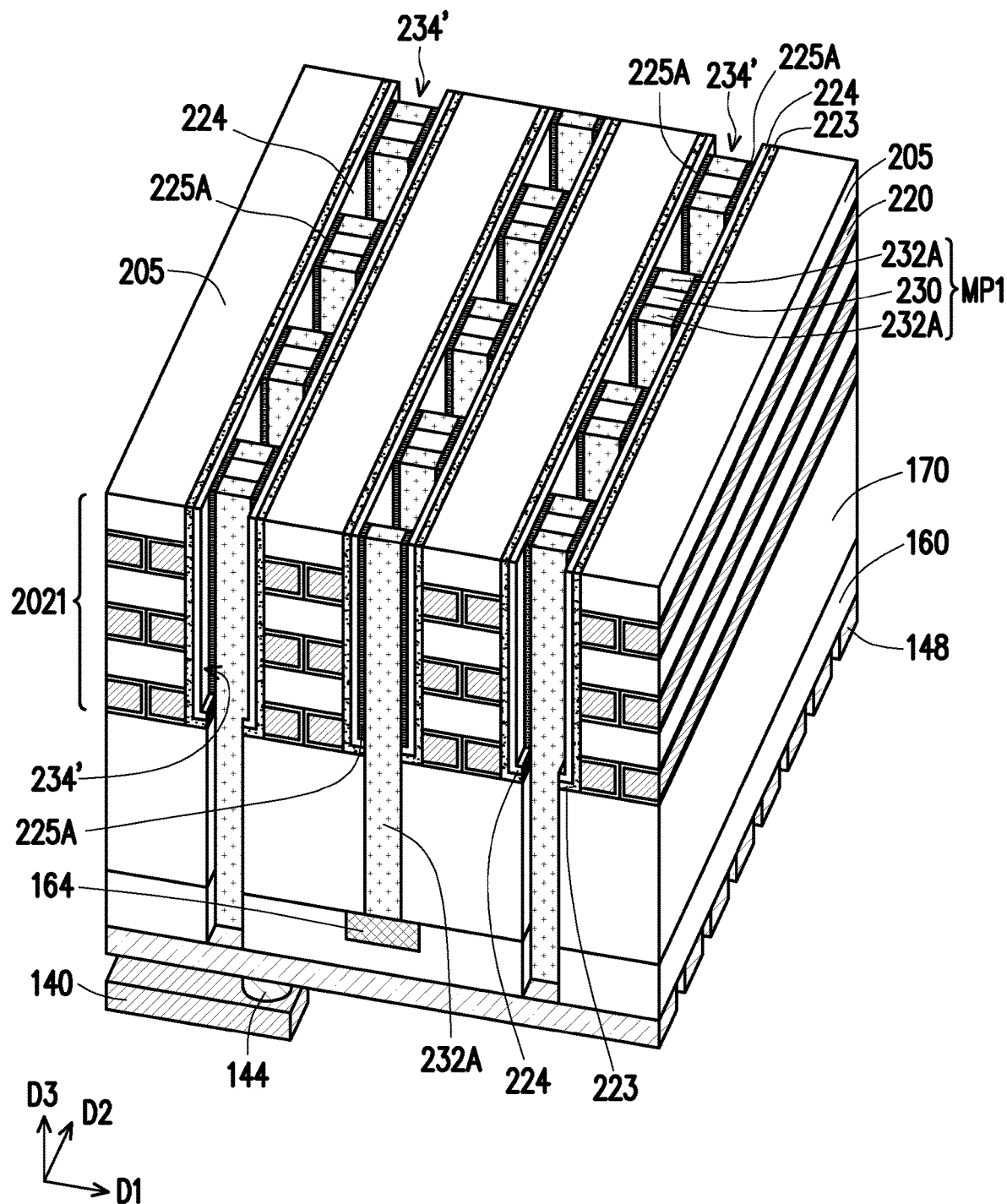

Referring to FIG. 22, using the mask patterns MP1 (the combination of dielectric blocks 230 and the insulation blocks 232A) as the etching masks, the exposed gate dielectric layers 225 are selectively removed by a selective etching process. In some embodiments, the selective etching process selectively removes the exposed gate dielectric layers 225 and does not remove the adjacent channel material layers 224 and memory material layers 223. In some embodiments, the remained gate dielectric layers 225A do not extend beyond the mask patterns MP1 along the extending direction (second direction D2). That is, the extending length of the gate dielectric layer 225A is substantially the same as the total lengths of the mask pattern MP1 along the trench extending direction (second direction D2). In some embodiments, by selectively removing the exposed gate dielectric layer 225, the trench openings 234 are enlarged to become the trench openings 234', the channel material layers 224 are exposed, and the trench openings 234' are located between the opposing channel material layers 224.

Figure 23:
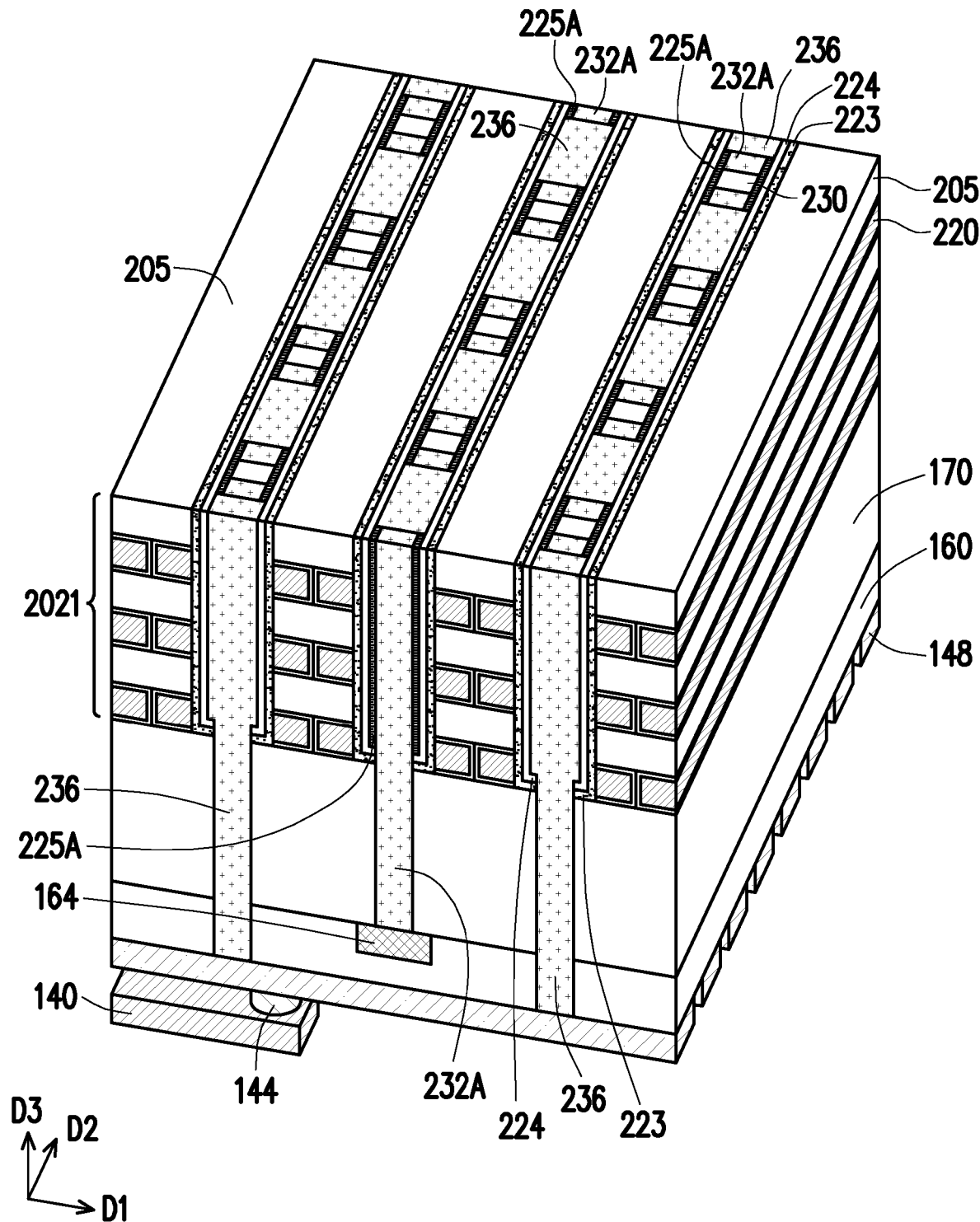

Referring to FIG. 23, insulation layers 236 are formed to fill up the trench openings 234' and are in contact with the exposed channel material layers 224. For example, the formation of the insulation layers 236 involves forming an insulating material over the stacks 2021 and filling up the enlarged trench openings 234' and performing a planarization process to remove the extra insulating material outside the trench openings 234'. In some embodiments, the material for forming the insulation layer 236 includes silicon oxide, silicon nitride, silicon oxynitride, silicon carbide, silicon oxycarbide, silicon carbonitride, or the combination thereof. In one embodiment, the insulating material of the insulation layers 236 includes silicon nitride. In some embodiments, the insulation layers 236 are formed by any compatible formation method, such as coating, CVD, PVD, ALD or the like. In some embodiments, the insulation layers 236 filled in the trench openings 234' are located between the insulation blocks 232A and between the channel material layers 224. The insulation layers 236 and the insulation blocks 232A vertically (along the third direction D3) penetrate through the stacks 2021 and the etch stop layer 170 to reach the etch stop patterns 164 or further through the etch stop layer 160 to reach the conductive lines 148. As shown in FIG. 23, two separate gate dielectric layers 225A are located on two opposing sidewalls of the insulation block 232A.

Figure 24:
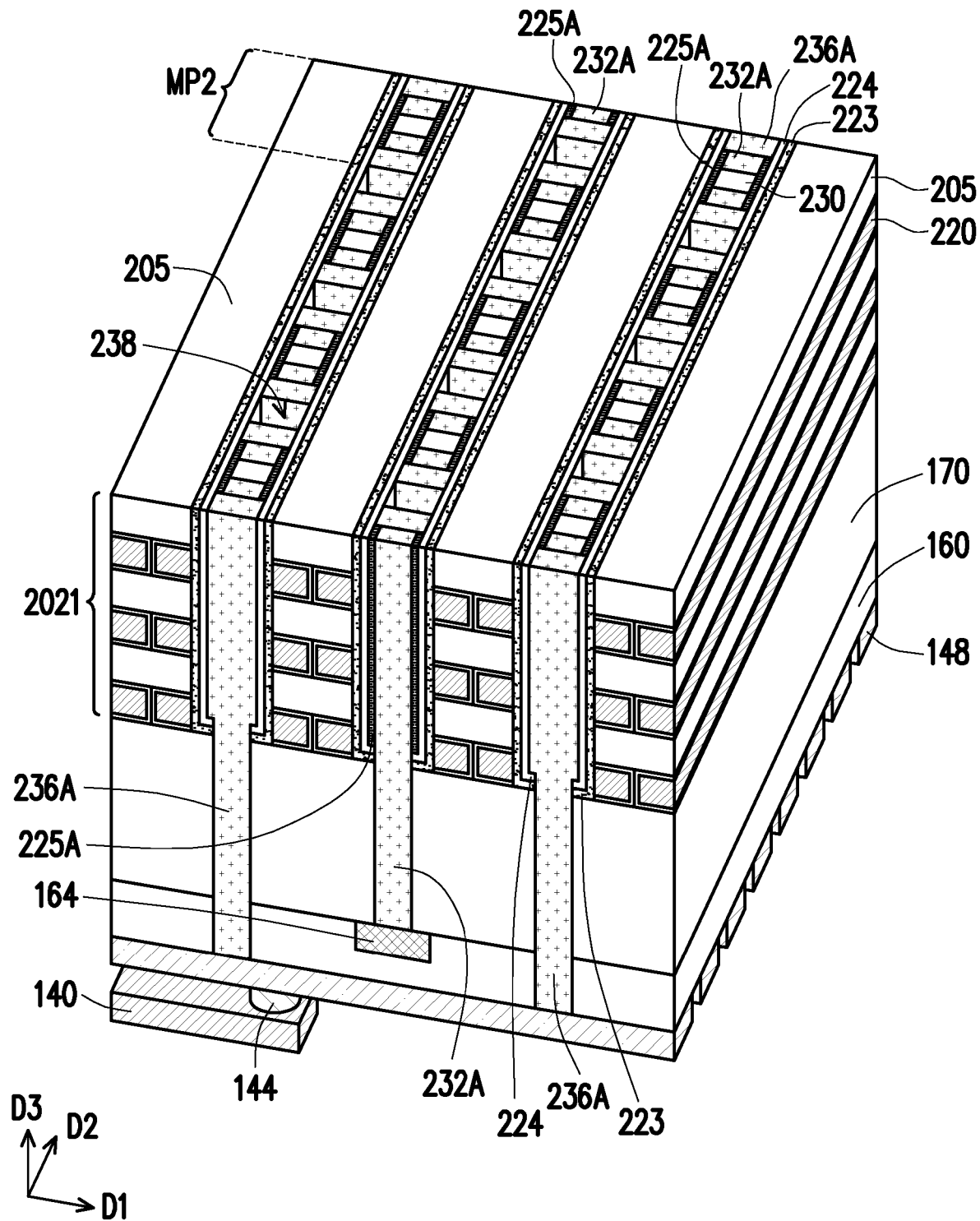

Referring to FIG. 24, an etching process is performed to the insulation layers 236 to form trench openings 238 in the insulation layers 236, and the channel material layers 224 are exposed by the trench openings 238. In some embodiments, the etching process is selective and does not remove the memory material layers 223, the channel material layers 224 and the gate dielectric layers 225A. In some embodiments, the trench openings 238 vertically extend through insulation layers 236 to expose the etch stop layer 160. The performed etching process may selectively remove the materials of the insulation layers 236 and stop at the etch stop layer 160. The trench openings 238 may be formed using the same or similar processes for the previous trenches, and thus details are not repeated herein. As illustrated in FIG. 24, since the trench openings 238 penetrate through the insulation layers 236 to expose the etch stop layer 160, the remained insulation blocks 236A vertically extend along the dielectric blocks 230 and the insulation blocks 232A to reach the etch stop layer 160. In FIG. 24, the insulation blocks 236A are separate from one another with a distance. The blocks 232A/230/232A (i.e. mask pattern MP1) and the gate dielectric layers 225A located at their both sides are sandwiched by two insulation blocks 236A to form a mask pattern MP2.

Figure 25:
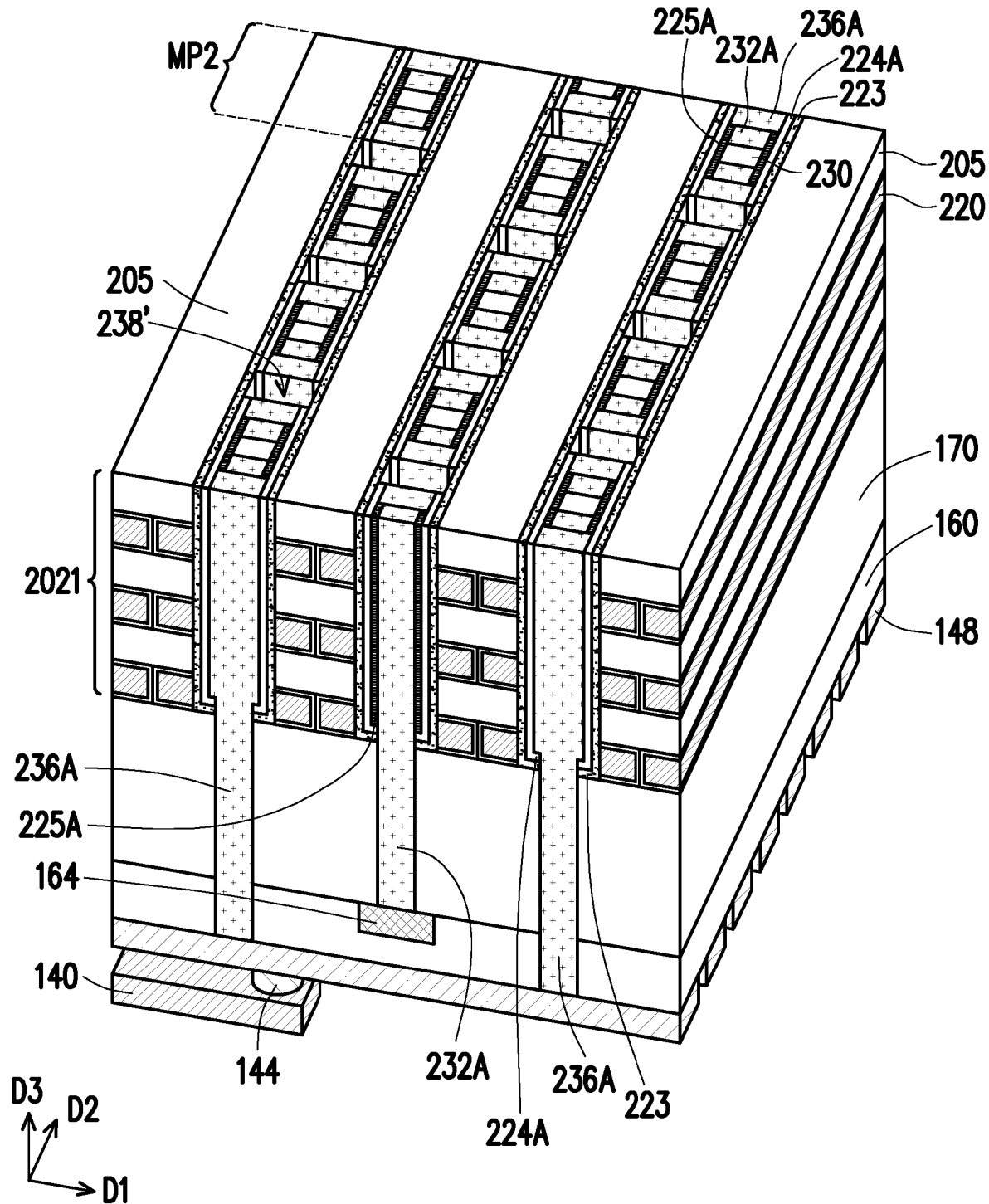

Referring to FIG. 25, using the mask patterns MP2 as the etching masks, the exposed channel material layer 224 are removed by a selective etching process. In some embodiments, the selective etching process selectively removes the exposed channel material layer 224 and does not remove or damage the adjacent conductive features 220 and the dielectric layers 205. In some embodiments, the remained channel material layers 224A do not extend beyond the mask patterns MP2 along the extending direction (second direction D2). That is, the extending length of the channel material layer(s) 224A is substantially the same as the total lengths of the mask pattern MP2 along the trench extending direction (second direction D2). In some embodiments, by selectively removing the exposed channel material layer 224, the trench openings 238 are enlarged to become the trench openings 238', sidewalls of the conductive features 220 and the dielectric layers 205 are exposed from the openings 238', and the trench openings 238' are located between the opposing conductive features 220. In alternative embodiments, the exposed memory material layers 223 are removed by a selective etching process using the mask patterns MP2 as the etching masks. In such embodiments, the remained memory material layers 223 do not extend beyond the mask patterns MP2 along the extending direction.

Figure 26:
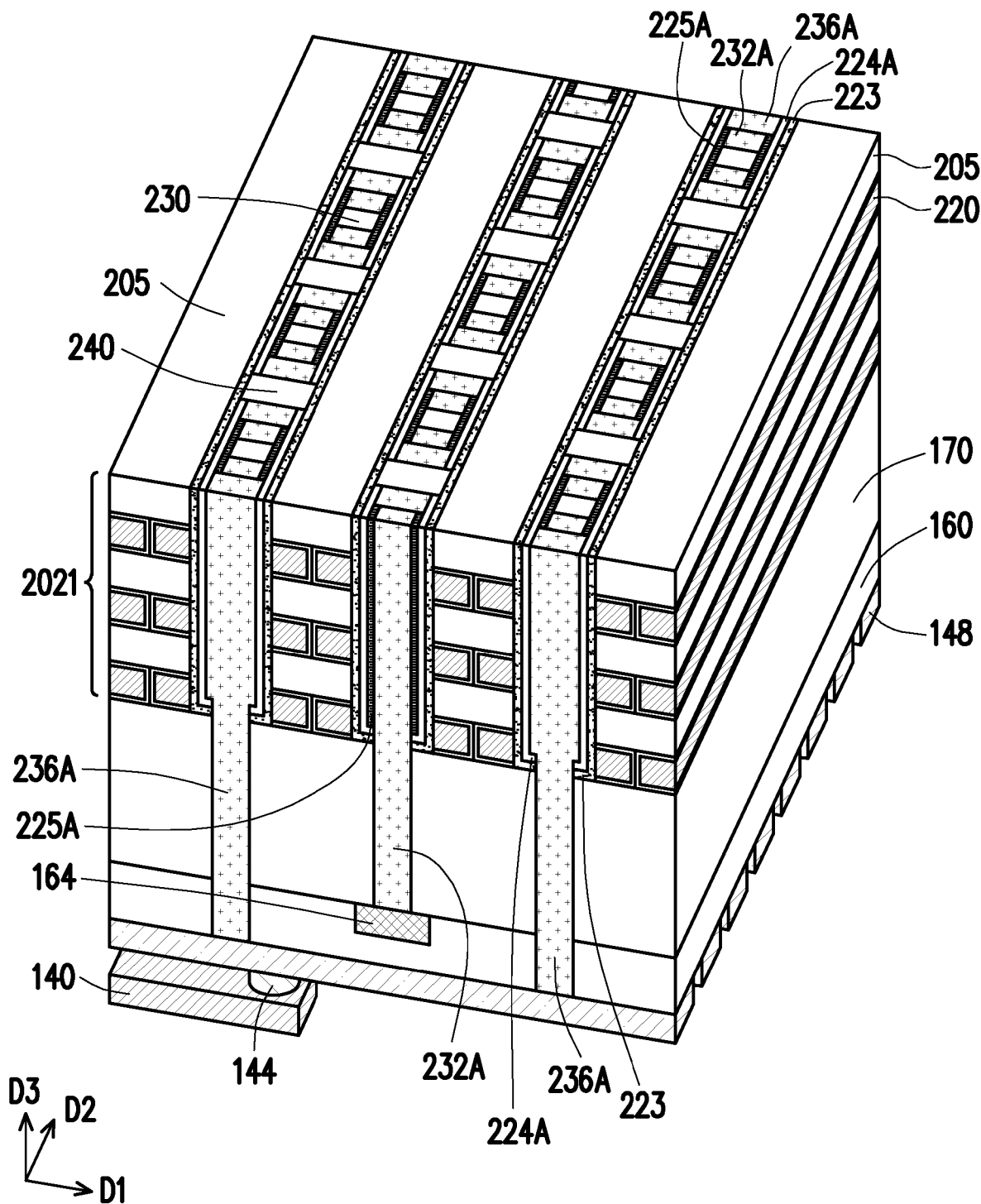

Referring to FIG. 26, dielectric layers 240 are formed to fill up the trench openings 238' and the sidewall recesses 239, so that the dielectric layers 240 are in direct contact with the remained conductive features 220 as well as in direct contact with the memory material layers 223, channel material layers 224A and insulation blocks 236A. For example, the formation of the dielectric layers 240 involves forming a dielectric material over the stacks 2021 and filling up the enlarged trench openings 238' and the sidewall recesses 239 and performing a planarization process to remove the extra dielectric material outside the trench openings 238'. In some embodiments, the material for forming the dielectric layers 240 includes silicon oxide, or one or more low-k dielectric materials or extra low-k (ELK) dielectric materials. In one embodiment, the low-k dielectric material has a dielectric constant of about less than 3.9. Examples of low-k or ELK dielectric materials include silicate glass such as fluoro-silicate-glass (FSG), phospho-silicate-glass (PSG) and boro-phospho-silicate-glass (BPSG), BLACK DIAMOND®, SILK®, FLARE®, hydrogen silsesquioxane (HSQ), fluorinated silicon oxide (SiOF), amorphous fluorinated carbon, parylene, BCB (bis-benzo-cyclobutenes), or a combination thereof. In one embodiment, the material of the dielectric layers 240 includes silicon oxide or SiOF. In some embodiments, the dielectric layers 240 are formed by any compatible formation method, such as coating, CVD, PVD, ALD or the like. In FIG. 26, the dielectric layers 240 extend vertically through the stacks 2021 and the etch stop layer 170 to reach the etch stop layer 160. In some embodiments, the dielectric layers 240 function as isolators for cell units.

Figure 27:
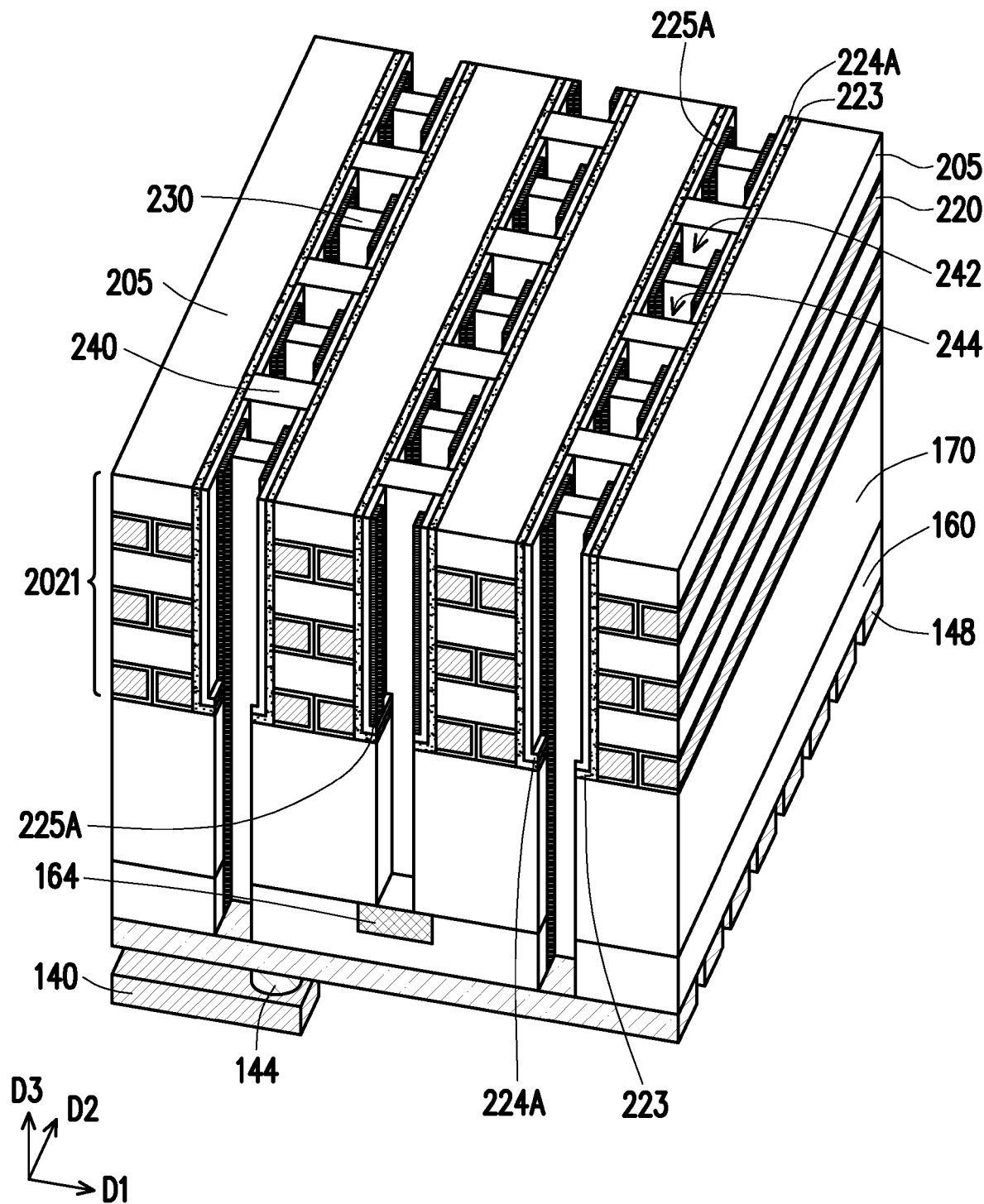

Referring to FIG. 27, an etching process is performed to remove the insulation blocks 236A and 232A to form openings 242, 244. In some embodiments, the openings 242, 244 are formed at locations where bits lines and source lines are to be formed, e.g., using suitable photolithography and etching techniques. In FIG. 27, the gate dielectric layers 225A, the channel material layers 224A and the dielectric blocks 230 are exposed by the openings 242, 244. In some embodiments, the etching process is selective and does not remove the gate dielectric layers 225A, the channel material layers 224A and the dielectric blocks 230. In some embodiments, the openings 242 vertically extend through the stacks 2021 and the etch stop layer 170 to expose the etch stop patterns 164, and the openings 244 vertically extend through the stacks 2021, the etch stop layer 170 and the etch stop layer 160 to expose the conductive lines 148. The performed etching process may selectively remove the materials of the insulation blocks 236A and 232A and stop at the etch stop patterns 164 or the conductive lines 148. In some embodiments, the openings 242 do not extend through the etch stop layer 160, in which case the later-formed source lines and/or bit lines are connected to electrically conductive features overlying the memory device. In some embodiments, the openings 244 extend through the etch stop layer 160, which may allow the subsequently formed source lines and/or bit lines to directly connect to the conductive lines 148. In some embodiments, the memory material layer 223, the channel material layer 224A, the gate dielectric layer 225A and the dielectric block 230 are located between two dielectric layers 240 and the openings 242, 244 are defined.

Figure 28:
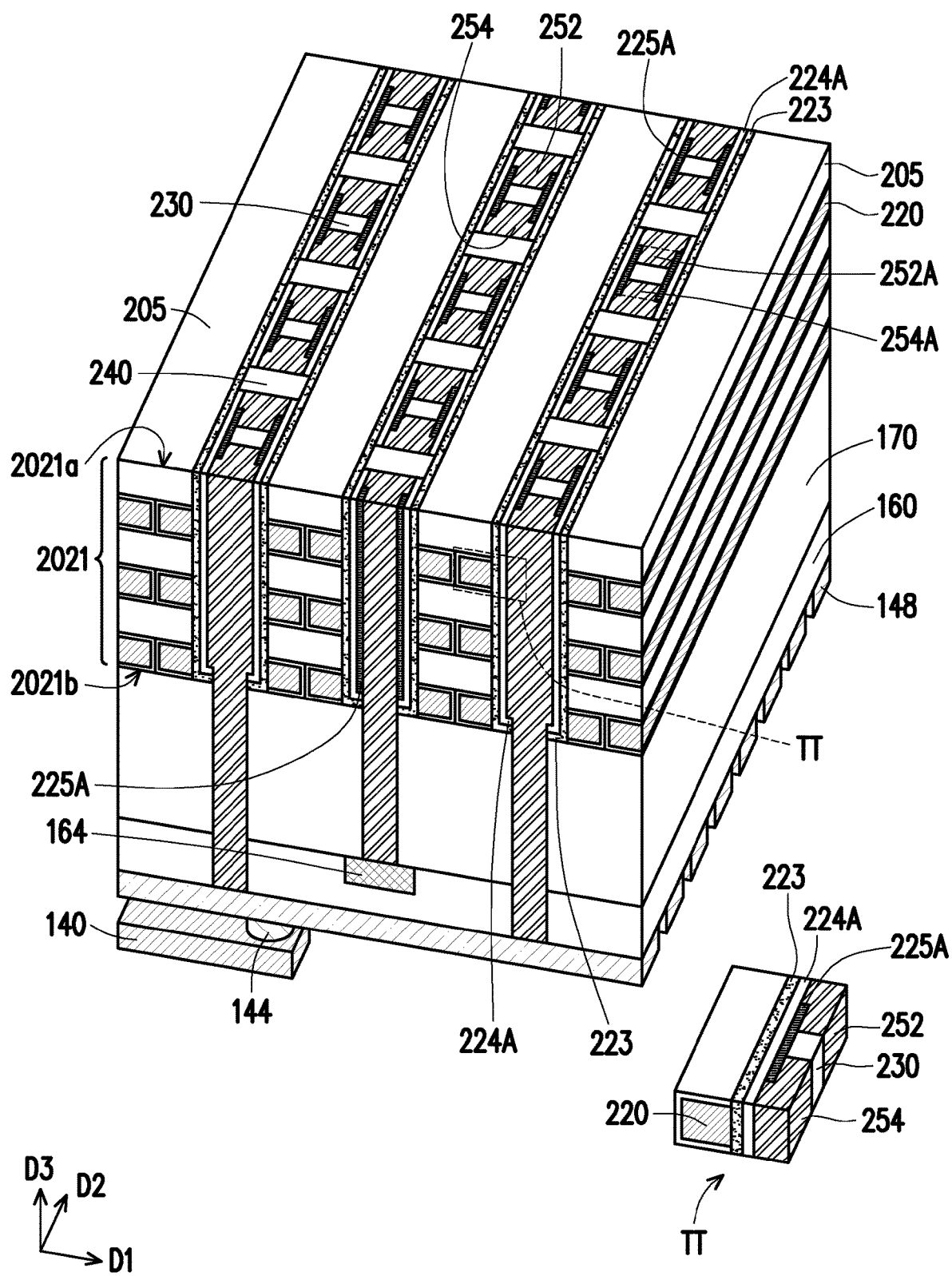

Referring to FIG. 28, conductive pillars 252 and 254 are formed filling up the openings 242 and 244 respectively. In some embodiments, the conductive pillars 252 and 254 respectively functioning as the source and drain terminals. In some embodiments, the conductive pillars 252 are source lines (e.g., local source lines) and the conductive pillars 254 are bit lines (e.g., local bit lines). In some other embodiments, the conductive pillars 252 are bit lines (e.g., local bit lines) and the conductive pillars 254 are source lines (e.g., local source lines). In some embodiments, the source lines and the bit lines are conductive pillars filled in the openings 242 and 244. In some embodiments, the conductive pillars 252 stop on the etch stop patterns 164 without penetrating the etch stop layer 160. In other words, the conductive pillars 252 are electrically isolated from the underlying conductive lines 148 through the etch stop patterns 164 and the etch stop layer 160. In some embodiments, the conductive pillars 254 penetrate through the etch stop layer 160 to be in physical contact with the conductive lines 148, so as to electrically connect to the conductive lines 148. In some embodiments, the conductive pillars 254 are electrically connected to the underlying FEOL circuits or devices through the conductive lines 148 and the conductive vias 144.

In some embodiments, the formation of the conductive pillars 252 and 254 involves forming an electrically conductive material (not shown) over the stacks and filling up the openings 242 and 244, and then the extra outside the openings is removed by performing a planarization process (such as CMP), an etching-back process, or other suitable processes. In some embodiments, the conductive materials of the conductive pillars 252 and 254 include one or more materials selected from tungsten (W), cobalt (Co), ruthenium (Ru), molybdenum (Mo), tantalum (Ta), titanium (Ti), copper, alloys thereof, and nitrides thereof, for example. In some embodiments, the formation of the conductive material includes forming seed/barrier materials and performing a plating process (such as electrochemical plating (ECP)) or CVD processes. In some embodiments, the barrier material includes titanium nitride (TiN) formed by the metal organic CVD (MOCVD) process, the seed material includes tungsten formed by CVD, and the conductive material includes tungsten formed by the CVD process (especially tungsten CVD processes).

In some embodiments, the conductive pillars 252 and 254 are connected with the gate dielectric layers 225A, the conductive pillars 252 extend from a first surface (e.g., a top surface) to a second surface (e.g., a bottom surface) opposite to the first surface of the stacks and reach the etch stop layer 160. The conductive pillars 254 may extend from the first surface (e.g., a top surface) to the second surface (e.g., a bottom surface) of the stacks and further extend into the etch stop layer 160, so as to reach the conductive lines 148. In some embodiments, sidewalls of the conductive pillars 254 are in direct contact with the etch stop layer 160. In some embodiments, the conductive pillars 252 and 254 extend along and through the channel material layers 224A, and extend along and through the gate dielectric layers 225A. In one embodiment, the conductive pillars 252 and 254 also extend through the memory material layer 223. In some embodiments, a width W2 (shown in FIG. 30) of the conductive pillar 252 in the etch stop layer 203 is smaller than the width W1 of the etch stop pattern 164. In alternative embodiments, the width W2 of the conductive pillar 252 in the etch stop layer 203 is substantially equal to the width W1 of the etch stop pattern 164. In some embodiments, a width (e.g., width W2) of the conductive pillar 254 in the etch stop layer 170 is substantially equal to a width of the conductive pillar 254 in the etch stop layer 160.

From the enlarged partial 3D view of a portion (enclosed by the dotted line to represent a cell unit) of the structure as shown at the right side of FIG. 28, it is seen that each memory cell TT includes a transistor with a memory material layer/film. For each transistor of the memory cell, the conductive feature(s) 220 (the word line) functions as the gate electrode of the transistor, and the conductive pillars 252, 254 (the source line and the bit line) function as the source/drain regions of the transistor, and the channel material layer 224A functions as the channel layer of the transistor. For each transistor, the dielectric block 230 disposed between the source/bit lines 252 and 254 functions as an isolation region. In some embodiments, the memory material layer 223 and the channel material layer 224A are sandwiched between and isolated by the two dielectric layers 240, and the memory material layer 223 works as the memory layer of the memory cell TT. That is, the memory material layer 223 is used to store the digital information (e.g., a bit "1" or "0") stored in the memory cell TT. From the top view of FIG. 28, the memory cells of the 3D memory device in different trenches are staggered, such that the memory cells in neighboring trenches are disposed along different rows, or the memory cells in alternating trenches are laterally aligned along the first direction D1. The memory material layer 223, the channel material layer 224A and the dielectric layer 225A extend along the conductive pillars 252, 254.

As shown in FIG. 28, each of the conductive pillars 252 and 254 (e.g. source lines/bit lines 254/252) has a T-shaped cross-section in the top planar view. Due to the relative configurations of the gate dielectric layer 225A and the channel material layer 224A, the conductive pillars 252 and 254 respectively have confined regions 252A and 254A that are defined between the gate dielectric layers 225A and the dielectric block 230 and extend along the opposing sidewalls of the gate dielectric layers 225A and the sidewalls of the dielectric block 230. In some embodiments, the configuration of the gate dielectric layers 225A allow the other regions of the conductive pillars 252 and 254 to contact the channel material layers 224A, but keeps the confined regions 252A and 254A separated from the channel material layers 224A that work as channel regions. As such, the confined regions 252A and 254A act as back gates without shorting the channel regions. In the embodiments, the memory material layers 223 and the channel material layers 224A of the transistors are disposed between the back gates and the word lines for the transistors. During a write operation (e.g., an erase or programming operation) for a transistor, the back gates can help reduce the surface potential of the channel material layers, which further improves the performance of the memory array.

Figure 29:
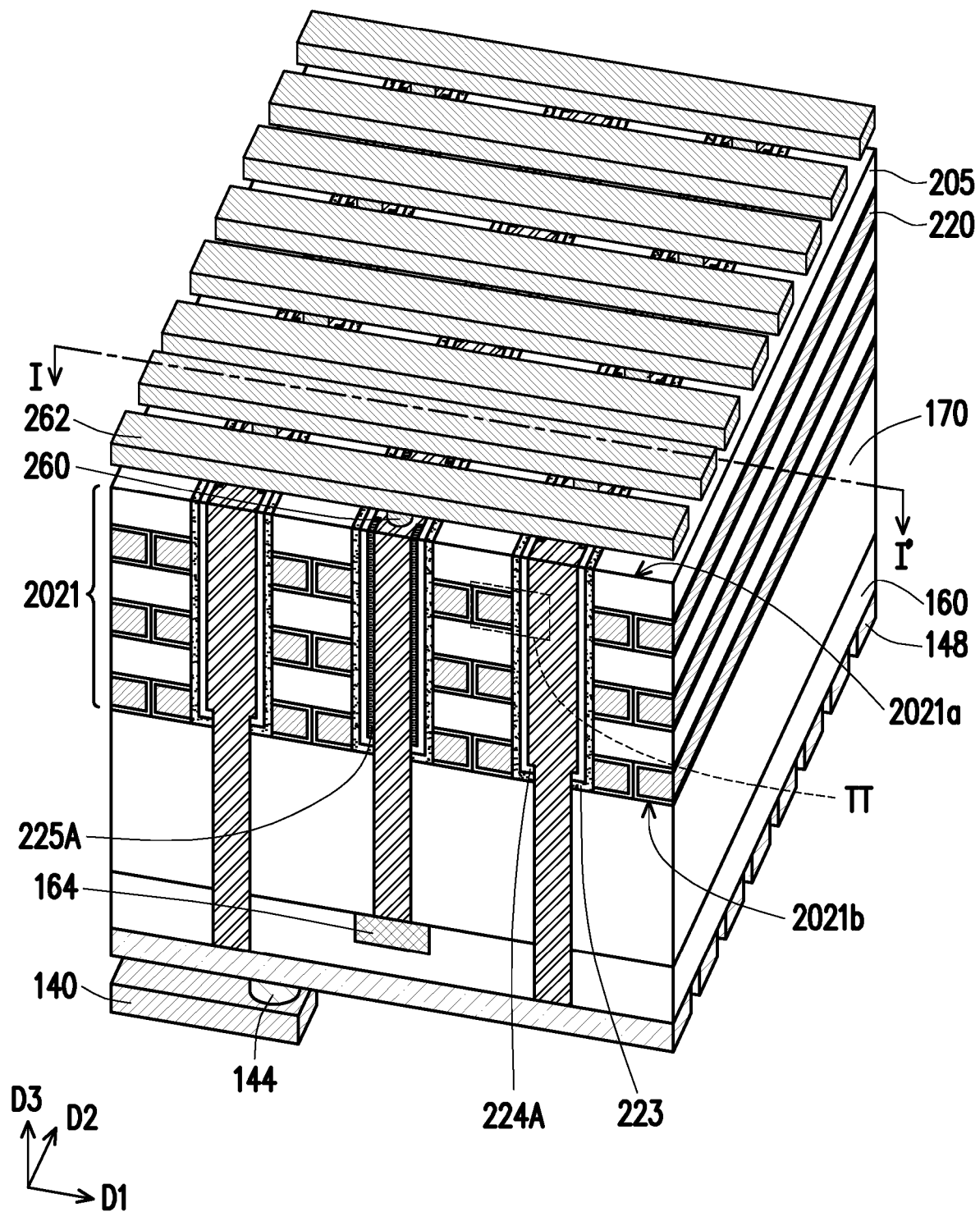
Figure 30:
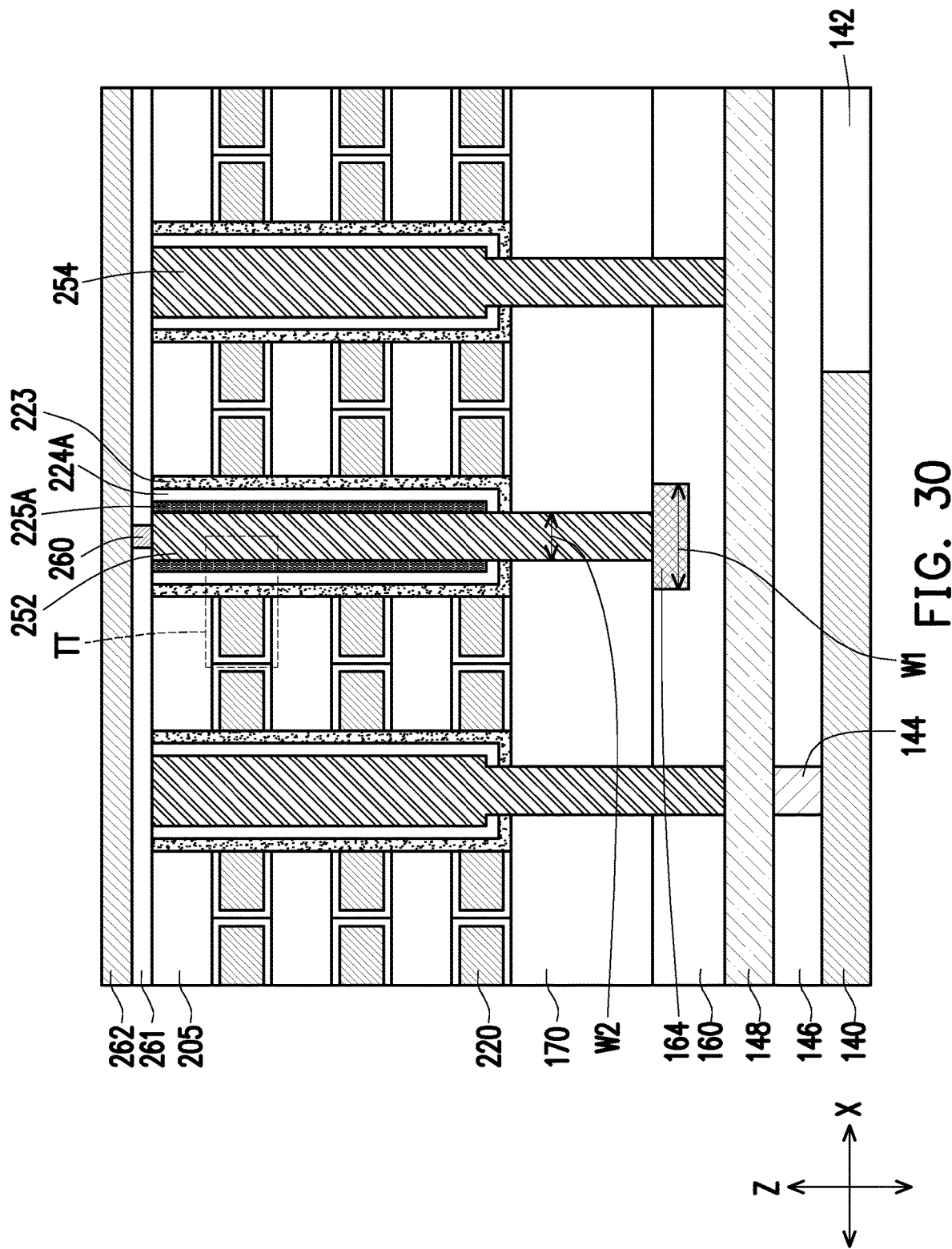
FIG. 30 is a schematic cross-sectional view showing the structure of FIG. 29 along crossline I-I'.

Referring to FIG. 29 and FIG. 30, conductive vias 260 and conductive lines 262 are formed over the stacks 2021 to electrically connect the conductive pillars 252. In some embodiments, the conductive vias 260 are formed in a dielectric layer 261, and the conductive lines 262 are formed on the dielectric layer 261 to electrically connect to the conductive vias 260. In some embodiments, the conductive lines 262 and the conductive lines 148 are formed at opposite sides of the stacks 2021. In some embodiments, the conductive lines 262 are source lines (e.g., global source lines) and the conductive lines 148 are bit lines (e.g., global bit lines). In some other embodiments, the conductive lines 262 are bit lines (e.g., global bit lines) and the conductive lines 148 are source lines (e.g., global source lines). In some embodiments, the conductive lines 262 extend along the first direction D1 and arranged in parallel along the second direction D2. The conductive vias 260 and the conductive lines 262 may be formed using a single damascene process respectively or a dual damascene process simultaneously. For example, a dielectric layer is patterned utilizing a combination of photolithography and etching techniques to form trenches corresponding to the desired patterns of the conductive vias 260 and/or the conductive lines 262. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the conductive vias 260 and/or the conductive lines 262 are formed by depositing a seed layer of copper or a copper alloy, and filling the trenches by electroplating. A chemical mechanical planarization (CMP) process or the like may be used to remove excess conductive material from a surface of the dielectric layer and to planarize surfaces of the dielectric layer and the conductive lines 262 for subsequent processing.

In some embodiments, the etch stop layer 160 has the etch stop patterns 164 therein, and thus the etching process for removing the materials of the etch stop layer 164 may stop at the etch stop patterns 164. Accordingly, the conductive pillars 252 may be formed on the etch stop layer 160 while the conductive pillars 254 penetrate the etch stop layer 160. In such embodiments, the conductive pillars 252 are electrically isolated from the underlying conductive lines 148 through the etch stop patterns 164 and the etch stop layer 160, and thus the conductive lines 148 (e.g., global bit lines) may be disposed directly under (i.e., in physical contact with) the etch stop layer 160. Thus, the conductive pillars 254 (e.g., local bit lines) may be electrically connected to the underlying FEOL circuits (e.g., conductive lines 140) through two layered interconnecting structure (e.g., the conductive lines 148 and the conductive vias 144). In such embodiments, there may be only two masks required for forming bit line routing structure, which reduces the cost and time for manufacturing the memory device.

Figure 31:
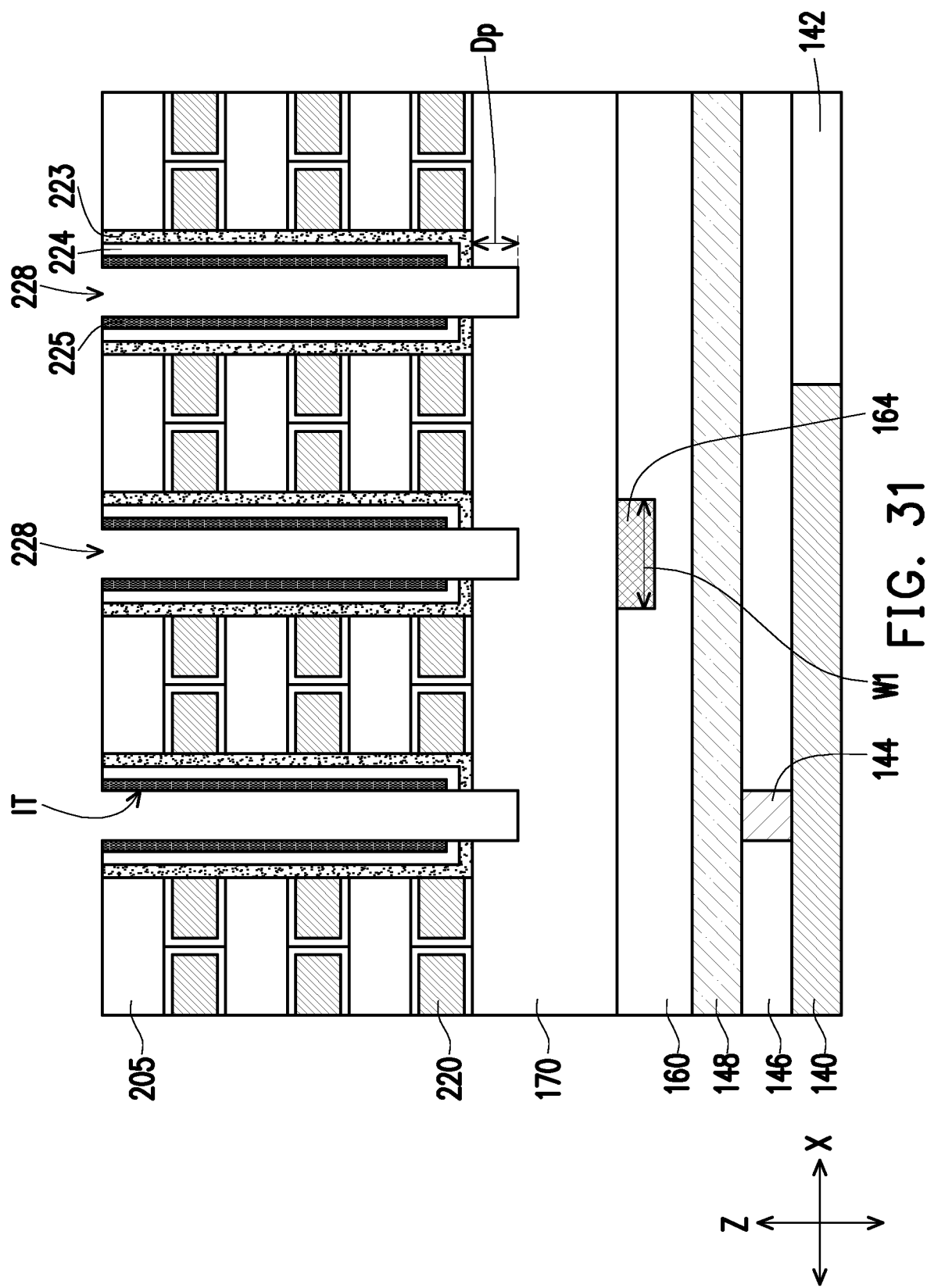
FIG. 31 to FIG. 33 show schematic cross-sectional views of structures produced at various stages of a manufacturing method of a memory device according to some embodiments of the present disclosure.
Figure 32:
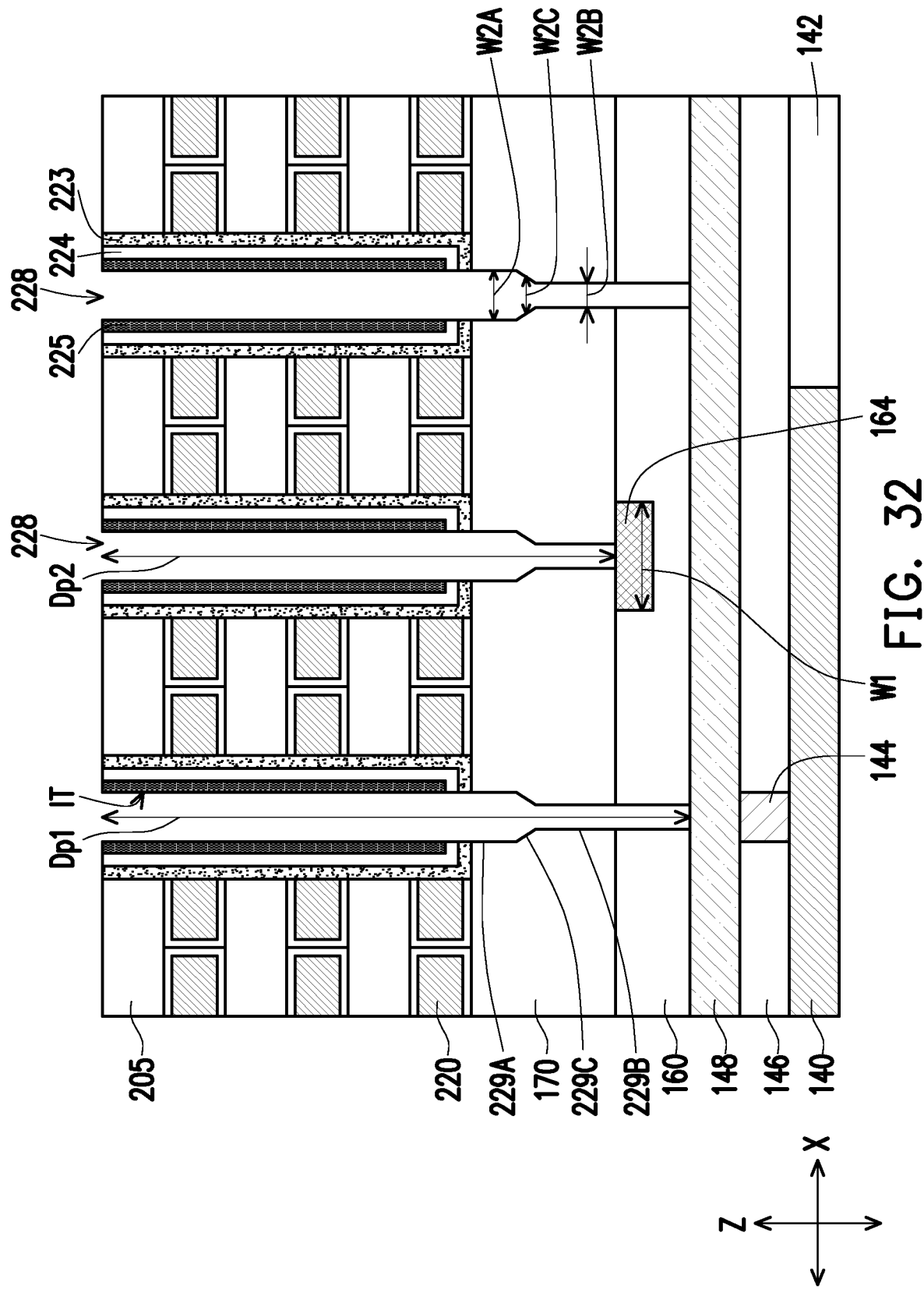
Figure 33:
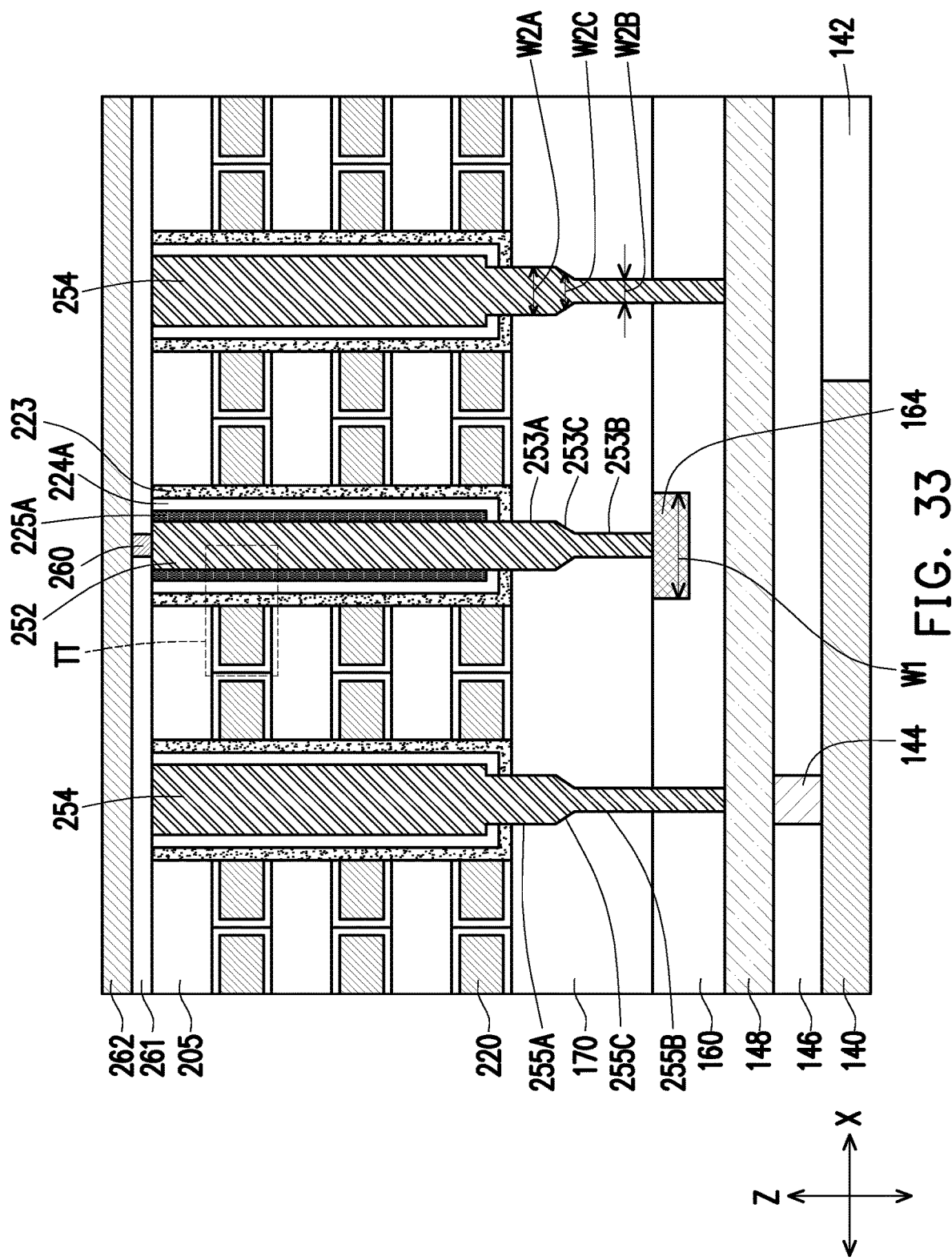

FIG. 31 to FIG. 33 show schematic cross-sectional views of structures produced at various stages of a manufacturing method of a memory device according to some embodiments of the present disclosure. The memory device of FIG. 33 is similar to the memory device of FIG. 30 and shows the structure similar to the structure of FIG. 29 along crossline I-I', and the difference lies in the configuration of the conductive pillars 254. Referring to FIG. 31, a structure of FIG. 17 is provided, and then a first etching process is performed to the dielectric layers 226 to form trench openings 228 in the dielectric layers 226. The first etching process is performed with a mask. In some embodiments, the first etching process is selective and does not remove the memory material layers 223, the channel material layers 224, and the gate dielectric layers 225. For example, the first etching process selectively removes the materials of the dielectric layers 226 and the etch stop layer 170. In addition, the first etching process (e.g., a time-controlled etching process) is controlled to stop at a depth Dp of the etch stop layer 170 without penetrating the entire thickness of the etch stop layer 170. In some embodiments, the trench openings 228 vertically extend through the dielectric layers 226 and beyond the stack 2021 and extend into the depth Dp of the etch stop layer 170.

Referring to FIG. 32, a second etching process is performed to extend the trench openings 228 into the etch stop layers 160 and 170. In some embodiments, the second etching process has high or acceptable etching selectivity between the materials of the etch stop layer 160 and the etch stop layer 170 and the materials of the conductive lines 148 and the etch stop patterns 164. Thus, the second etching process may simultaneously remove the materials of the etch stop layer 160 and the etch stop layer 170 and stop on the tops of the conductive lines 148 and the etch stop patterns 164. After performing the second etching process, each trench opening 228 may have a first portion 229A, a second portion 229B and a third portion 229C between the first portion 229A and the second portion 229B. In some embodiments, the first portion 229A is formed in the etch stop layer 170 by the first etching process and has a substantially constant width W2A (along the first direction DO. In some embodiments, the width W2A is substantially the same as the width W2 of the inner trenches IT. In alternative embodiments, the trench opening 228 of FIG. 31 is enlarged laterally due to partial removal by the second etch process, and thus the width W2A of the first portion of 229A is larger than the width W2 of the inner trenches IT. The second portion 229B and the third portion 229C are formed by the second etching process. The second portion 229B is formed in the etch stop layers 160 and 170 and has a substantially constant width W2B (along the first direction DO smaller than the width W2A of the first portion 229A. The third portion 229C is formed in the etch stop layer 170 and has a variable width W2C between the width W2A and the width W2B, and the width W2C decreases as the third portion 229C becomes closer to the underlying conductive lines 148. For example, the third portion 229C has an inclined or slanted sidewall. In some embodiments, the trench opening 228 has depths Dp1, Dp2 (along the third direction D3) larger than the height of the stack 202I. The depth Dp1 is substantially equal to a total of the height H2 of the stack 202I and the thickness of the etch stop layer 170, and the depth Dp2 is substantially equal to a total of the height H2 of the stack 202I, the thickness of the etch stop layer 170 and the thickness of the etch stop layer 160. Although sidewalls of the first portion 229A and the second portion 229B are shown as straight vertical sidewalls, the sidewalls may have sloped profiles, or concave or convex surfaces.

Referring to FIG. 33, after performing the steps similar to FIG. 20 to FIG. 28, the memory device is formed. In some embodiments, the conductive pillars 252 penetrate through the etch stop layer 170 and are in physical contact with the etch stop patterns 164, and the conductive pillars 254 penetrate through the etch stop layers 160 and 170 and are in physical contact with the conductive lines 148. In some embodiments, each conductive pillar 252 may have a first portion 253A, a second portion 253B and a third portion 253C between the first portion 253A and the second portion 253B. In some embodiments, the first portion 253A is disposed in the etch stop layer 170 and has a substantially constant width W2A (along the first direction DO. The second portion 253B is disposed in the etch stop layers 160 and 170 and has a substantially constant width W2C (along the first direction DO smaller than the width W2A of the first portion 253A. The third portion 253C is disposed in the etch stop layer 170 and has a variable width W2C between the width W2A and the width W2B, and the width W2C decreases as the third portion 253C becomes closer to the underlying conductive lines 148. For example, the third portion 253C has an inclined sidewall. In some embodiments, each conductive pillar 254 may have a first portion 255A, a second portion 255B and a third portion 255C between the first portion 255A and the second portion 255B. In some embodiments, the first portion 255A is disposed in the etch stop layer 170 and has a substantially constant width W2A (along the first direction DO. The second portion 255B is disposed in the etch stop layer 170 and has a substantially constant width W2C (along the first direction DO smaller than the width W2A of the first portion 255A. The third portion 255C is disposed in the etch stop layers 160 and 170 and has a variable width W2C between the width W2A and the width W2B, and the width W2C decreases as the third portion 255C becomes closer to the underlying conductive lines 148. For example, the third portion 255C has an inclined sidewall. Although sidewalls of the first portion 253A, 255A and the second portion 253B, 255B are shown as straight vertical sidewalls, the sidewalls may have sloped profiles, or concave or convex surfaces.

Figure 34:
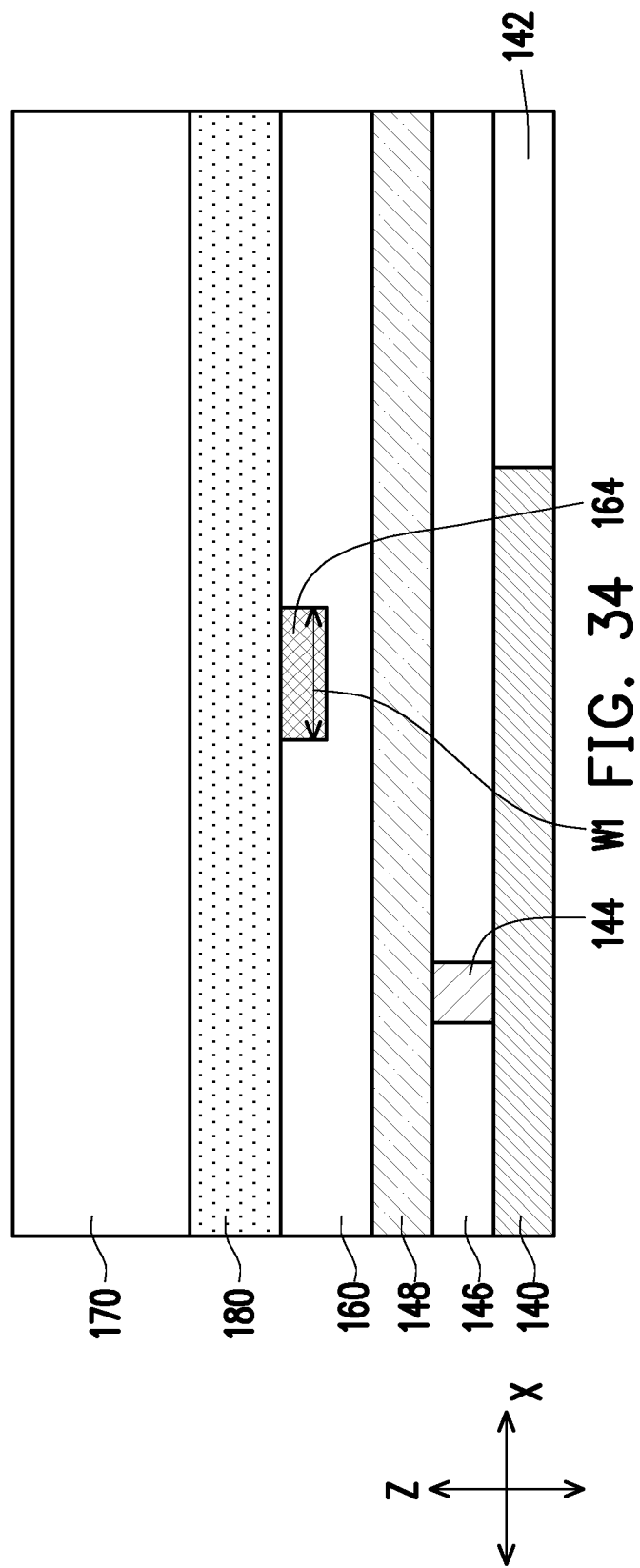
FIG. 34 to FIG. 37 show schematic cross-sectional views of structures produced at various stages of a manufacturing method of a memory device according to some embodiments of the present disclosure.
Figure 35:
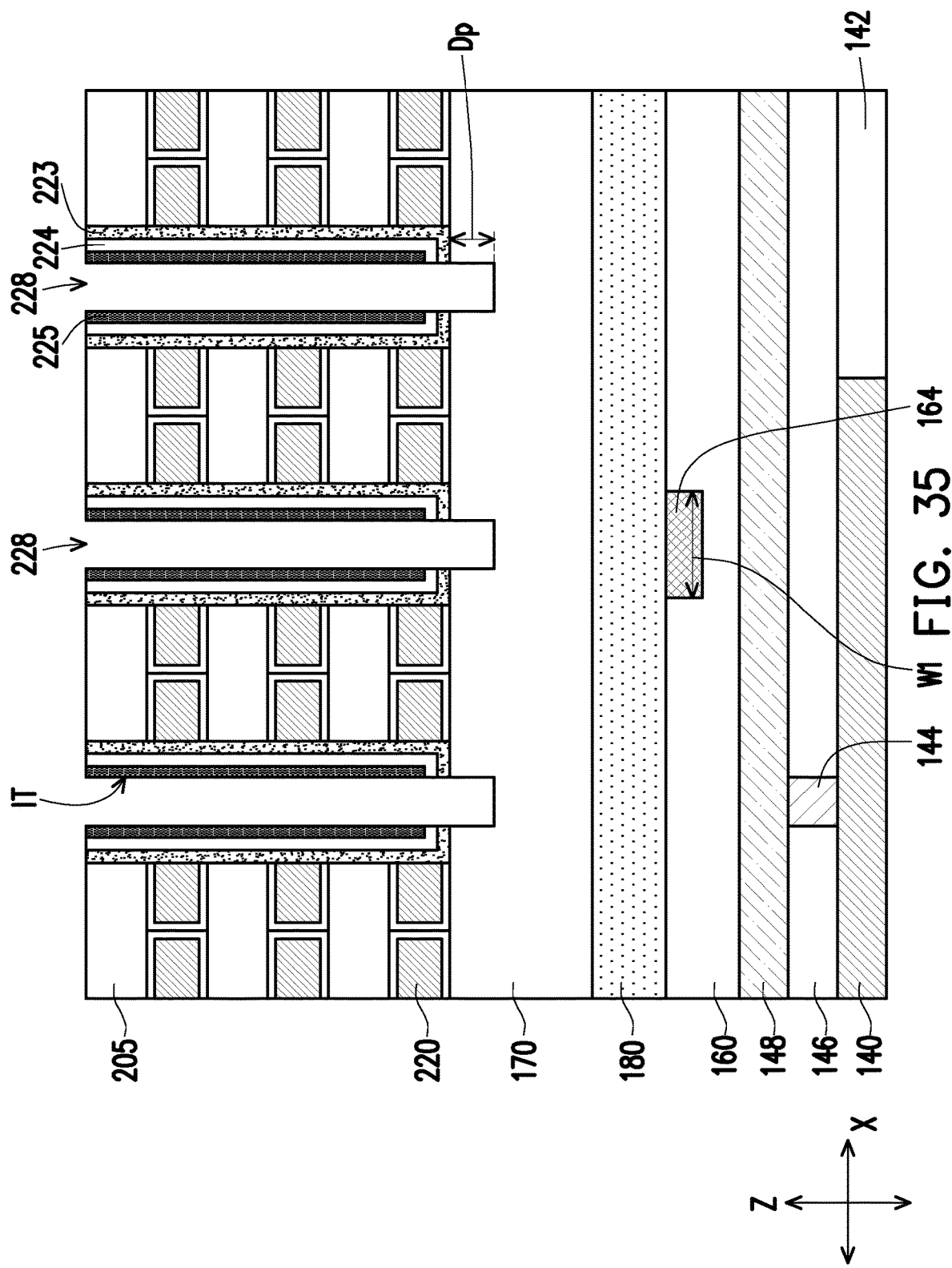
Figure 36:
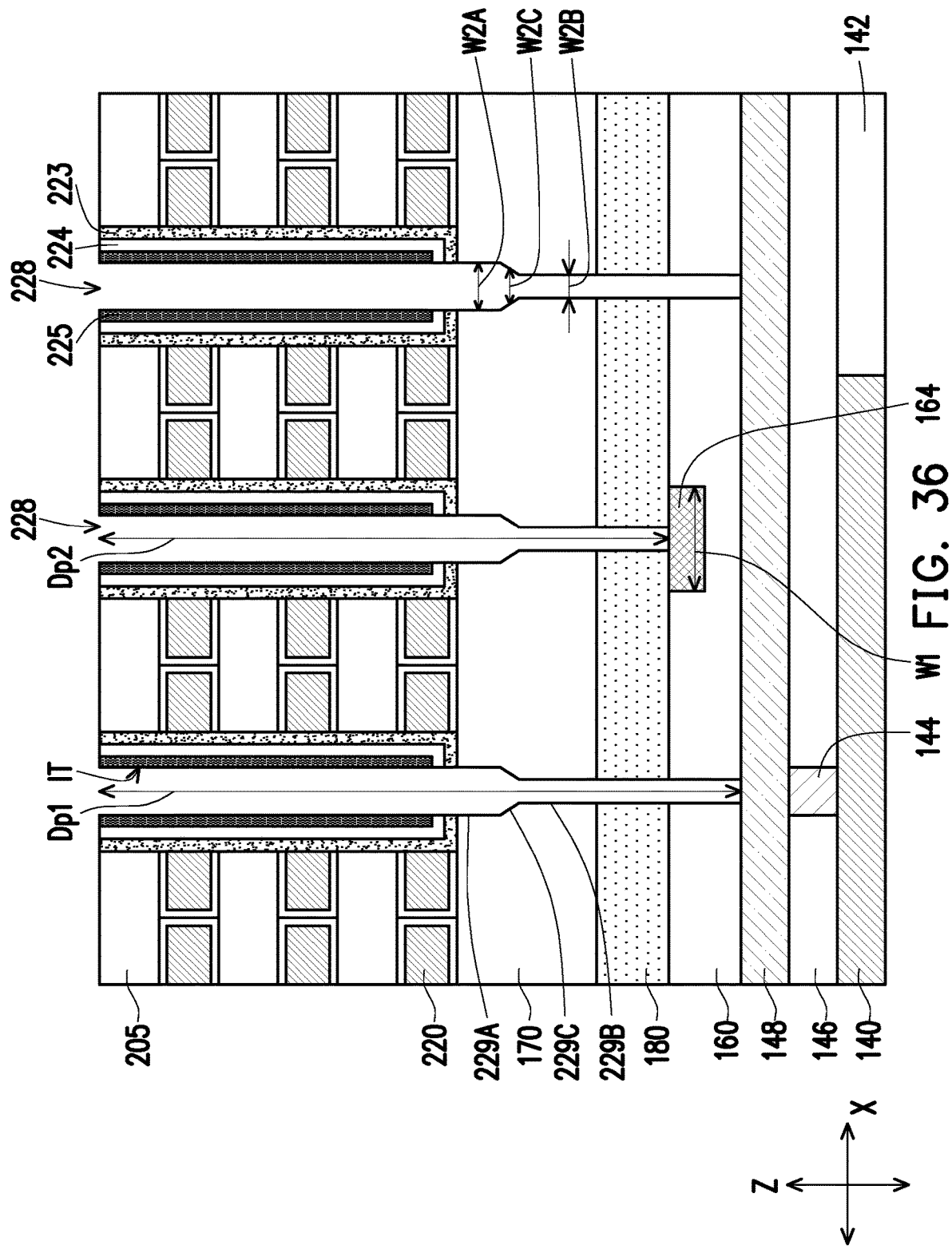
Figure 37:
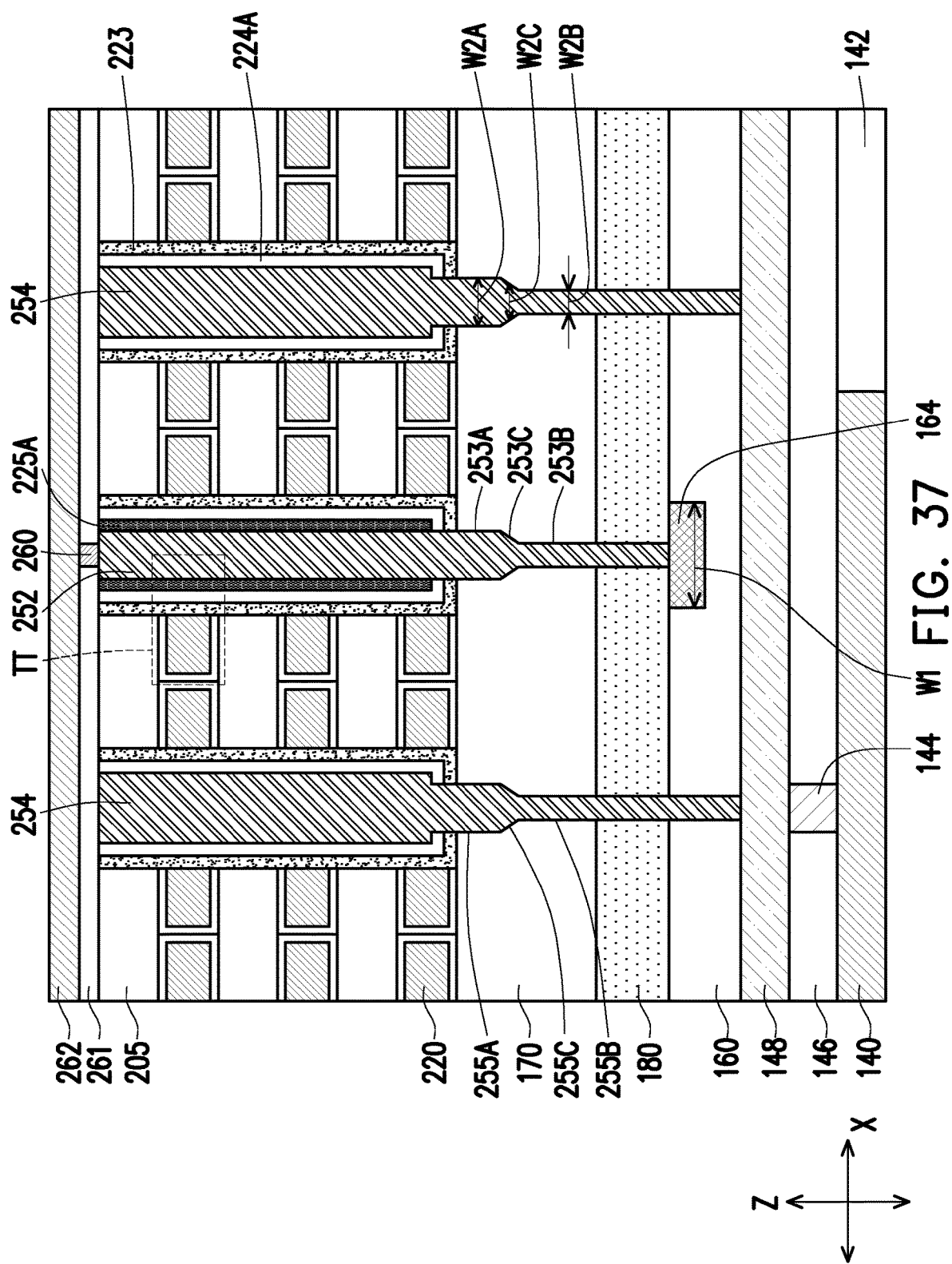

FIG. 34 to FIG. 37 show schematic cross-sectional views of structures produced at various stages of a manufacturing method of a memory device according to some embodiments of the present disclosure. The memory device of FIG. 37 is similar to the memory device of FIG. 33, and the difference lies in adding an etch stop layer 180 between the etch stop layers 160 and 170. Referring to FIG. 34, in some embodiments, after forming a plurality of etch stop patterns 164 in the etch stop layer 160, an etch stop layer 180 is formed on the etch stop layer 160 to cover the etch stop patterns 164 and the etch stop layer 160. In some embodiments, a material of the etch stop layer 180 is substantially the same as or has a similar etching selectivity of the material of the etch stop layer 160 with respect to an etchant. In some embodiments, the etch stop patterns 164 are disposed at the interface of the etch stop layer 160 and the etch stop layer 180, that is, the etch stop patterns 164 are inserted between the etch stop layer 160 and the etch stop layer 180. In an embodiment in which the etch stop layer 160 and the etch stop layer 180 have the same material, the etch stop patterns 164 is embedded in the material of the etch stop layer 160 and the etch stop layer 180. The formation of the etch stop layer 180 may involve similar techniques and process used for forming the etch stop layer 160, and the details will not be repeated herein. After forming the etch stop layer 180, the etch stop layer 170 is formed on the etch stop layer 180. In some embodiments, materials of the etch stop layer 170, the etch stop patterns 164 and the etch stop layer 180 are selected so that they are etched selectively relative each other. In some embodiments, the etch stop layer 170 is sandwiched between the etch stop layer 160 and the etch stop layer 180.

Referring to FIG. 35, after performing the steps similar to FIG. 6 to FIG. 17 on the structure of FIG. 34, a first etching process is performed to the dielectric layers 226 to form trench openings 228 in the dielectric layers 226. The first etching process is similar to the first etching process of FIG. 31. For example, the first etching process (e.g., a time-controlled etching process) is controlled to stop at a depth Dp of the etch stop layer 170 without penetrating the entire thickness of the etch stop layer 170. In some embodiments, the trench openings 228 vertically extend through the dielectric layers 226 and beyond the stack 202I and extend into the depth Dp of the etch stop layer 170.

Referring to FIG. 36, a second etching process is performed to extend the trench openings 228 into the etch stop layers 160, 170 and 180. In some embodiments, the second etching process has high or acceptable etching selectivity between the materials of the etch stop layers 160, 170 and 180 and the materials of the conductive lines 148 and the etch stop patterns 164. Thus, the second etching process may simultaneously remove the materials of the etch stop layer 160, 170 and 180 and stop on the tops of the conductive lines 148 and the etch stop patterns 164. After performing the second etching process, each trench opening 228 may have a first portion 229A, a second portion 229B and a third portion 229C between the first portion 229A and the second portion 229B. In some embodiments, the first portion 229A is formed in the etch stop layer 170 by the first etching process and has a substantially constant width W2A (along the first direction DO. In some embodiments, the width W2A is substantially the same as the width W2 of the inner trenches IT. In alternative embodiments, the trench opening 228 of FIG. 35 is enlarged laterally due to partial removal by the second etch process, and thus the width W2A of the first portion of 229A is larger than the width W2 of the inner trenches IT. The second portion 229B and the third portion 229C are formed by the second etching process. The second portion 229B is formed in the etch stop layers 160, 170 and 180 and has a substantially constant width W2C (along the first direction DO smaller than the width W2A of the first portion 229A. The third portion 229C is formed in the etch stop layer 170 and has a variable width W2C between the width W2A and the width W2B, and the width W2C decreases as the third portion 229C becomes closer to the underlying conductive lines 148. For example, the third portion 229C has an inclined sidewall. In some embodiments, the trench opening 228 has a variable depth between the depth Dp1 and the depth Dp2 (along the third direction D3). The depth Dp1 is substantially equal to a total of the height H2 of the stack 2021, and the depth Dp2 is substantially equal to a total of the height H2 of the stack 2021, the thickness of the etch stop layer 170 and the thickness of the etch stop layer 160. Although sidewalls of the first portion 229A and the second portion 229B are shown as straight vertical sidewalls, the sidewalls may have sloped profiles, or concave or convex surfaces.

Referring to FIG. 37, after performing the steps similar to FIG. 20 to FIG. 28, the memory device is formed. In some embodiments, the conductive pillars 252 penetrate through the etch stop layer 170 and are in physical contact with the etch stop patterns 164, and the conductive pillars 254 penetrate through the etch stop layer 160 and are in physical contact with the conductive lines 148. In some embodiments, each conductive pillar 254 may have a first portion 255A, a second portion 255B and a third portion 255C between the first portion 255A and the second portion 255B. In some embodiments, the first portion 255A is disposed in the etch stop layer 170 and has a substantially constant width W2A (along the first direction D1). The second portion 255B is disposed in the etch stop layers 160, 170 and 180 and has a substantially constant width W2B (along the first direction D1) smaller than the width W2A of the first portion 255A. The third portion 255C is disposed in the etch stop layer 170 and has a variable width W2C between the width W2A and the width W2B, and the width W2C decreases as the third portion 255C becomes closer to the underlying conductive lines 148. For example, the third portion 255C has an inclined sidewall. In alternative embodiments, the etch stop layers 160, 170 and 180 may be removed by the same etching process as the removal process of the dielectric layers 226. In such embodiments, the formed conductive pillar 254 in the etch stop layers 160, 170 and 180 has substantially a constant width (e.g., width W2).

Figure 38:
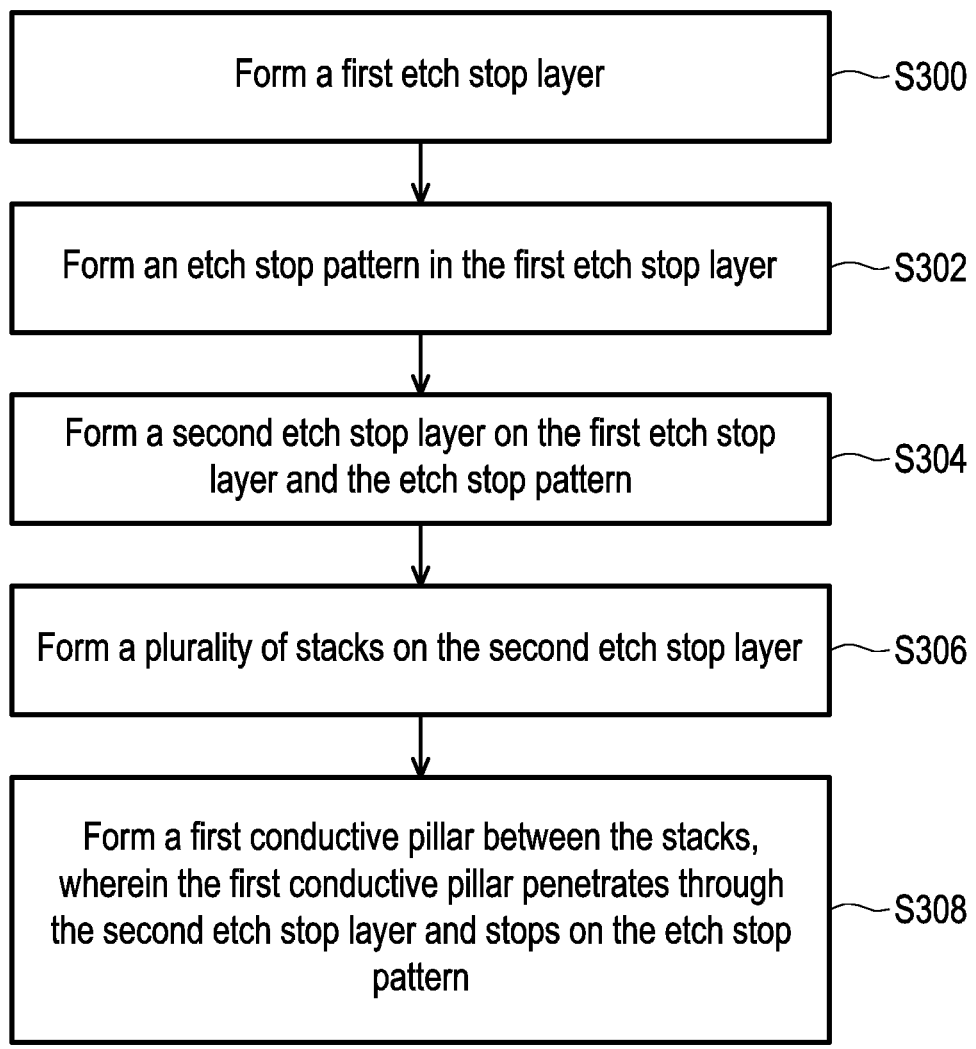
FIG. 38 illustrates a method of forming a memory device in accordance with some embodiments.

FIG. 38 illustrates a method of forming a memory device in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act S300, a first etch stop layer is formed. FIG. 3 illustrates a view corresponding to some embodiments of act S300.

At act S302, an etch stop pattern is formed in the first etch stop layer. FIG. 4 and FIG. 34 illustrate a view corresponding to some embodiments of act S302.

At act S304, a second etch stop layer is formed on the first etch stop layer and the etch stop pattern. FIG. 5 and FIG. 34 illustrate a view corresponding to some embodiments of act S304.

At act S306, a plurality of stacks are formed on the second etch stop layer. FIG. 6 and FIG. 35 illustrate a view corresponding to some embodiments of act S304.

At act S308, a first conductive pillar is formed between the stacks, wherein the first conductive pillar penetrates through the second etch stop layer and stops on the etch stop pattern. FIG. 7 to FIG. 30, FIG. 31 to FIG. 33, FIG. 36 and FIG. 37 illustrate varying views corresponding to some embodiments of act S306.

In accordance with some embodiments of the disclosure, a memory device includes a first etch stop layer, an etch stop pattern, a second etch stop layer, a plurality of stacks and a first conductive pillar. The etch stop pattern is disposed in the first etch stop layer. The second etch stop layer is disposed on the first etch stop layer and the etch stop pattern, wherein a material of the etch stop pattern is different from a material of the first etch stop layer and a material of the second etch stop layer. The stacks are disposed on the second etch stop layer. The first conductive pillar is disposed between the stacks, wherein the first conductive pillar extends along the stacks and the second etch stop layer to be in physical contact with the etch stop pattern.

In accordance with some embodiments of the disclosure, a memory device includes a first etch stop layer, an etch stop pattern, a second etch stop layer, a third etch stop layer, a plurality of stacks and a first conductive pillar. The etch stop pattern is disposed in the first etch stop layer. The second etch stop layer is disposed on the first etch stop layer and the etch stop pattern, wherein a material of the etch stop pattern is different from a material of the first etch stop layer and a material of the second etch stop layer. The third etch stop layer is disposed on the second etch stop layer, wherein the second etch stop layer is disposed between the first and third etch stop layers. The stacks are disposed on the third etch stop layer. The first conductive pillar is disposed between the stacks, wherein the first conductive pillar penetrates through the second etch stop layer and the third etch stop layer and stops on a surface of the etch stop pattern.

In accordance with some embodiments of the disclosure, a method of forming a memory device includes the following steps. A first etch stop layer is formed. An etch stop pattern is formed in the first etch stop layer. A second etch stop layer is formed on the first etch stop layer and the etch stop pattern. A plurality of stacks are formed on the second etch stop layer. A first conductive pillar is formed between the stacks, wherein the first conductive pillar penetrates through the second etch stop layer and stops on the etch stop pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a first etch stop layer;
an etch stop pattern in the first etch stop layer;
a second etch stop layer on the first etch stop layer and the etch stop pattern, wherein a material of the etch stop pattern is different from a material of the first etch stop layer and a material of the second etch stop layer, and the materials of the etch stop pattern, the first etch stop layer and the second etch stop layer are dielectric materials;
a plurality of stacks, disposed on the second etch stop layer; and
a first conductive pillar between the stacks, wherein the first conductive pillar extends along the stacks and the second etch stop layer to be in physical contact with the etch stop pattern.

2. The memory device of claim 1, wherein a first surface of the etch stop pattern is substantially coplanar with a first surface of the first etch stop layer.

3. The memory device of claim 2, wherein a second surface opposite to the first surface of the etch stop pattern is disposed between the first surface of the first etch stop layer and a second surface opposite to the first surface of the first etch stop layer.

4. The memory device of claim 1, wherein a width of the etch stop pattern is larger than or substantially equal to a width of a portion of the first conductive pillar penetrating through the second etch stop layer.

5. The memory device of claim 1, wherein the material of the second etch stop layer is different from the material of the first etch stop layer.

6. The memory device of claim 1, wherein a portion of the first conductive pillar penetrating through the second etch stop layer has at least two different widths.

7. The memory device of claim 1, further comprising a second conductive pillar between the stacks, wherein the second conductive pillar extends along the stacks and penetrates through the first etch stop layer and the second etch stop layer.

8. The memory device of claim 1, wherein the stacks are arranged along a first direction, and each of the stacks comprises a plurality of conductive lines extended along a second direction substantially perpendicular to the first direction and stacked on one another.

9. The memory device of claim 1, further comprising a plurality of memory material layers and a plurality of channel layers, the memory material layers and the channel layers extending between the stacks and covering sidewalls of the stacks, wherein the first conductive pillar is in lateral contact with the stacks through the memory material layers and the channel layers.

10. A memory device, comprising:
a first etch stop layer;
an etch stop pattern in the first etch stop layer;
a second etch stop layer on the first etch stop layer and the etch stop pattern, wherein a material of the etch stop pattern is different from a material of the first etch stop layer and a material of the second etch stop layer, and the materials of the etch stop pattern, the first etch stop layer and the second etch stop layer are dielectric materials;
a third etch stop layer on the second etch stop layer, wherein the second etch stop layer is disposed between the first and third etch stop layers;
a plurality of stacks, disposed on the third etch stop layer; and
a first conductive pillar between the stacks, wherein the first conductive pillar penetrates through the second etch stop layer and the third etch stop layer and stops on a surface of the etch stop pattern.

11. The memory device of claim 10, wherein the material of the first etch stop layer is the same as the material of the second etch stop layer.

12. The memory device of claim 10, wherein the first conductive pillar is in physical contact with the etch stop pattern is substantially coplanar with a surface of the etch stop pattern.

13. The memory device of claim 10, wherein a width of a portion of the first conductive pillar in the third etch stop layer is larger than or substantially equal to a width of a portion of the first conductive pillar in the second etch stop layer.

14. The memory device of claim 10, wherein a portion of the first conductive pillar penetrating through the third etch stop layer has at least two different widths.

15. The memory device of claim 10, further comprising a second conductive pillar between the stacks, wherein the second conductive pillar extends along the stacks and penetrates through the first etch stop layer, the second etch stop layer and the third etch stop layer.

16. The memory device of claim 15, further comprising a first conductive line over the stacks and a second conductive line underlying the stacks, wherein the first conductive pillar is electrically connected to the first conductive line and the second conductive pillar is electrically connected to the second conductive line.

17. A memory device, comprising:
a first etch stop layer;
an etch stop pattern in the first etch stop layer;
a second etch stop layer on the first etch stop layer and the etch stop pattern, and materials of the etch stop pattern, the first etch stop layer and the second etch stop layer are dielectric materials;
a plurality of stacks on the second etch stop layer; and
a first conductive pillar between the stacks, wherein the first conductive pillar penetrates through the second etch stop layer and disposed on the etch stop pattern.

18. The memory device of claim 17, further comprising a third etch stop layer between the first etch stop layer and the second etch stop layer, wherein the material of the etch stop pattern is different from a material of the third etch stop layer.

19. The memory device of claim 17, wherein the first conductive pillar a first vertical sidewall, a second vertical sidewall and an incline sidewall between the first and second vertical sidewalls.

20. The memory device of claim 17, wherein the first conductive pillar is in direct contact with the etch stop pattern.

* * * * *